(12) United States Patent
Shih

(10) Patent No.: US 11,127,628 B1
(45) Date of Patent: Sep. 21, 2021

(54) SEMICONDUCTOR DEVICE WITH CONNECTING STRUCTURE HAVING A STEP-SHAPED CONDUCTIVE FEATURE AND METHOD FOR FABRICATING THE SAME

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/820,267

(22) Filed: Mar. 16, 2020

(51) Int. Cl.
| | |
|---|---|
| *H01L 25/065* | (2006.01) |
| *H01L 25/04* | (2014.01) |
| *H01L 21/768* | (2006.01) |
| *H01L 23/31* | (2006.01) |
| *H01L 23/538* | (2006.01) |
| *H01L 25/075* | (2006.01) |
| *H01L 23/522* | (2006.01) |
| *H01L 21/02* | (2006.01) |
| *H01L 21/306* | (2006.01) |

(Continued)

(52) U.S. Cl.
CPC .... *H01L 21/76843* (2013.01); *H01L 21/0274* (2013.01); *H01L 21/02164* (2013.01); *H01L 21/02304* (2013.01); *H01L 21/30604* (2013.01); *H01L 21/76814* (2013.01); *H01L 23/5226* (2013.01); *H01L 24/05* (2013.01); *H01L 24/12* (2013.01); *H01L 2224/0231* (2013.01); *H01L 2224/0233* (2013.01); *H01L 2224/0401* (2013.01)

(58) Field of Classification Search
CPC ....... H01L 23/481; H01L 25/18; H01L 24/09; H01L 24/82; H01L 24/05
See application file for complete search history.

(56) References Cited

U.S. PATENT DOCUMENTS

| | | | | |
|---|---|---|---|---|
| 2011/0049724 | A1* | 3/2011 | Anderson | ........... H01L 21/7682 |
| | | | | 257/773 |
| 2015/0108644 | A1* | 4/2015 | Kuang | .................. H01L 25/043 |
| | | | | 257/751 |

(Continued)

*Primary Examiner* — Brian Turner

(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes a first semiconductor structure, a first connecting structure, and a second semiconductor structure positioned on the first connecting structure. The first connecting structure includes a first connecting insulating layer positioned on the first semiconductor structure, two first conductive layers positioned in the first connecting insulating layer, and a first porous layer positioned between the two first conductive layers. The second semiconductor structure is positioned on the first connecting structure and includes two second conductive features positioned on the two first conductive layers. The first conductive layer has a first width, the second conductive feature has a second width greater than the first width, and the different width forms a step-shaped cross-sectional profile near an interface of the first conductive layer and the second conductive feature.

18 Claims, 30 Drawing Sheets

(51) Int. Cl.
*H01L 23/00* (2006.01)
*H01L 21/027* (2006.01)

(56) References Cited

U.S. PATENT DOCUMENTS

2016/0093591 A1* 3/2016 Lan .................... H01L 21/6835
257/506
2021/0098407 A1* 4/2021 Elsherbini ............. H01L 23/481

* cited by examiner

SEMICONDUCTOR DEVICE WITH CONNECTING STRUCTURE HAVING A STEP-SHAPED CONDUCTIVE FEATURE AND METHOD FOR FABRICATING THE SAME

TECHNICAL FIELD

The present disclosure relates to a semiconductor device and a method for fabricating the semiconductor device, and more particularly, to a semiconductor device with a connecting structure having a step-shaped conductive feature and a method for fabricating the semiconductor device with the connecting structure.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the down-scaling process, and such issues are continuously increasing in quantity and complexity. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device comprising: a first semiconductor structure; a first connecting structure comprising a first connecting insulating layer positioned on the first semiconductor structure, two first conductive layers positioned in the first connecting insulating layer, and a first porous layer positioned between the two first conductive layers; and a second semiconductor structure positioned on the first connecting structure and comprising two second conductive features positioned on the two first conductive layers; wherein the first conductive layer has a first width, the second conductive feature has a second width greater than the first width, forming a step-shaped cross-sectional profile near an interface of the first conductive layer and the second conductive feature.

In some embodiments, the semiconductor device further comprises a third porous layer positioned on the connecting insulating layer, and a fourth porous layer positioned between the third porous layer and the second semiconductor structure; wherein a porosity of the fourth porous layer is less than a porosity of the third porous layer.

In some embodiments, the third porous layer positioned between the connecting insulating layer and the second semiconductor structure and surrounding the first conductive layer, wherein a porosity of the third porous layer is between about 25% and about 50%.

In some embodiments, the first connecting insulating layer comprises a first bottom insulating layer positioned on the first semiconductor structure, and a first top insulating layer positioned on the first bottom insulating layer, wherein the two first conductive layers penetrate the first bottom insulating layer and the first top insulating layer, and the first porous layer penetrates the first top insulating layer and extends into the first bottom insulating layer.

In some embodiments, the two first conductive layers comprise two first portions positioned on the first semiconductor structure and two second portions positioned on the first portions, wherein a width of the second portions is greater than a width of the first portions.

In some embodiments, the semiconductor device further comprises a plurality of first top liners positioned on the first top insulating layer and surrounding the two second portions.

In some embodiments, the semiconductor device further comprises a plurality of first bottom liners positioned between the plurality of first top liners and the first top insulating layer, between the two first conductive layers and the first top insulating layer, between the two first conductive layers and the first bottom insulating layer, between the first porous layer and the first top insulating layer, and between the first porous layer and the first bottom insulating layer.

In some embodiments, bottom surfaces of the plurality of first bottom liners are at a vertical level higher than a vertical level of a top surface of the first semiconductor structure.

In some embodiments, the semiconductor device further comprises a plurality of barrier layers positioned between the two first conductive layers and the plurality of first top liners, between the two first conductive layers and the plurality of first bottom liners, between the two first conductive layers and the first top insulating layer, between the two first conductive layers and the first bottom insulating layer, and between the two first conductive layers and the first semiconductor structure.

In some embodiments, the first semiconductor structure comprises a plurality of first conductive features positioned below the first portions, wherein a width of the plurality of first conductive features is greater than a width of the first portions.

In some embodiments, a porosity of the first porous layer is between about 25% and about 100%.

In some embodiments, the second semiconductor structure comprises a plurality of guard rings positioned on the first connecting structure, and the first connecting structure comprises a plurality of first supporting layers positioned below the plurality of guard rings, wherein a thickness of the plurality of first supporting layers is less than a thickness of the two first conductive layers.

In some embodiments, the semiconductor device further comprises a second connecting structure positioned between the first connecting structure and the second semiconductor structure, wherein the second connecting structure comprises two second conductive layers positioned between the two first conductive layers and the plurality of second conductive features, and a second porous layer positioned between the two second conductive layers, wherein a porosity of the second porous layer is between about 25% and about 100%.

Another aspect of the present disclosure provides a method for fabricating a semiconductor device, comprising: providing a first semiconductor structure; forming a first connecting structure comprising a first connecting insulating layer on the first semiconductor structure, two first conductive layers in the first connecting insulating layer, and a first porous layer between the two first conductive layers; and bonding a second semiconductor structure to the first connecting structure, wherein the second semiconductor structure comprises two second conductive features contacting the two first conductive layers; wherein the first conductive layer has a first width, the second conductive feature has a second width greater than the first width, forming a step-shaped cross-sectional profile near an interface of the first conductive layer and the second conductive feature.

In some embodiments, the method for fabricating the semiconductor device further comprises: forming a third porous layer on the connecting insulating layer, and forming a fourth porous layer of the second semiconductor structure; wherein the fourth porous layer is less than a porosity of the third porous layer.

In some embodiments, the third porous layer positioned between the connecting insulating layer and the second semiconductor structure and surrounding the first conductive layer, wherein a porosity of the third porous layer is between about 25% and about 50%.

In some embodiments, forming the first connecting structure comprises: forming the first connecting insulating layer on the first semiconductor structure; forming the two first conductive layers in the first connecting insulating layer and a first energy-removable layer between the two first conductive layers; and performing an energy treatment to turn the first energy-removable layer into the first porous layer.

In some embodiments, the energy-removable layer comprises a base material and a decomposable porogen material.

In some embodiments, the base material comprises methylsilsesquioxane, low-dielectric materials, or silicon oxide.

In some embodiments, an energy source of the energy treatment is heat, light, or a combination thereof.

Due to the design of the semiconductor device of the present disclosure, multiple semiconductor devices may be connected together through the first connecting structure to provide a more sophisticated function while occupying less space. Therefore, the cost of the semiconductor device may be reduced, and the profitability of the semiconductor device may be increased. In addition, the first porous layer may alleviate an interference effect between electrical signals induced in or applied to the first connecting structure.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
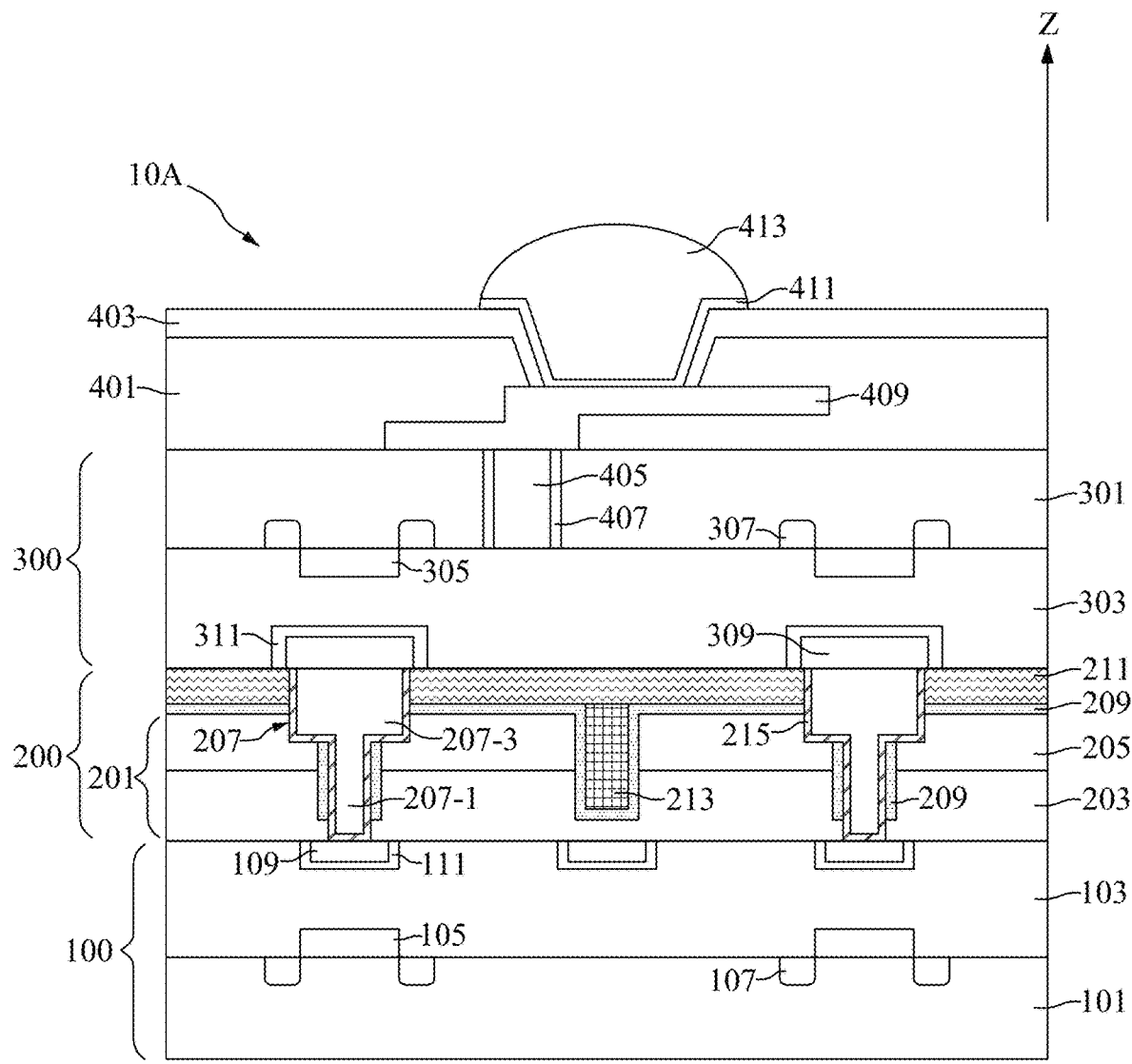
FIG. 1 illustrates, in a schematic cross-sectional diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

It should be noted that the term "about" modifying the quantity of an ingredient, component, or reactant of the present disclosure refers to variation in the numerical quantity that can occur, for example, through typical measuring and liquid-handling procedures used for making concentrates or solutions. Furthermore, variation can occur from inadvertent error in measuring procedures, differences in the manufacture, source, or purity of the ingredients employed to make the compositions or carry out the methods, or the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, a surface of an element (or a feature) located at the highest vertical level along the direction Z is referred to as a top surface of the element (or the feature). A surface of an element (or a feature) located at the lowest vertical level along the direction Z is referred to as a bottom surface of the element (or the feature).

FIG. 1 illustrates, in a schematic cross-sectional diagram, a semiconductor device 10A in accordance with one embodiment of the present disclosure.

With reference to FIG. 1, the semiconductor device 10A may include a first semiconductor structure 100, a first connecting structure 200, a second semiconductor structure 300, a bottom passivation layer 401, a top passivation layer 403, a through substrate via 405, spacers 407, a redistribution layer 409, an under bump metallization layer 411, and a conductive bump 413. The first semiconductor structure 100 and the second semiconductor structure 300 may be a semiconductor wafer, a portion of a semiconductor wafer, or a semiconductor die. In the embodiment depicted, the first semiconductor structure 100 and the second semiconductor structure 300 are semiconductor dies. The first semiconductor structure 100 may include a first substrate 101, a first insulating layer 103, a plurality of first device elements 105, a plurality of first doped regions 107, a plurality of first conductive features 109, and barrier layers 111 of the first semiconductor structure 100.

With reference to FIG. 1, the first substrate 101 may be formed of, for example, silicon, silicon carbide, germanium silicon germanium, gallium arsenic, indium arsenide, indium, or other semiconductor materials including group III, group IV, and group V elements. In some embodiments, the first substrate 101 may include a silicon-on-insulator structure. For example, the first substrate 101 may include a buried oxide layer formed using a process such as separation by implanted oxygen.

With reference to FIG. 1, the first insulating layer 103 may be disposed on the first substrate 101. In some embodiments, the first insulating layer 103 may be a stacked layer structure. The first insulating layer 103 may include a plurality of first insulating sub-layers. Each of the plurality of first insulating sub-layers may have a thickness between about 0.5 micrometers and about 3.0 micrometers. The plurality of first insulating sub-layers may be formed of, for example, silicon oxide, borophosphosilicate glass, undoped silicate glass, fluorinated silicate glass, low-k dielectric materials, the like, or a combination thereof. The plurality of first insulating sub-layers may be formed of different materials, but are not limited thereto. The low-k dielectric materials may have a dielectric constant less than 3.0 or even less than 2.5. In some embodiments, the low-k dielectric materials may have a dielectric constant less than 2.0.

With reference to FIG. 1, the first device elements 105 may be disposed in a lower portion of the first insulating layer 103. In some embodiments, the first device elements 105 may be disposed on the first substrate 101 (only two first device elements 105 are shown in FIG. 1 for clarity). The plurality of first device elements 105 may be, for example, bipolar junction transistors, metal-oxide-semiconductor field-effect transistors, diodes, flash memories, dynamic random-access memories, static random-access memories, electrically erasable programmable read-only memories, image sensors, micro-electro-mechanical systems, active devices, or passive devices. The plurality of first doped regions 107 may be disposed in the first substrate 101 and respectively correspondingly adjacent to two sides of the plurality of first device elements 105 (only two first doped regions 107 are shown in FIG. 1 for clarity). In some embodiments, the plurality of first doped regions 107 may be electrically insulated from neighboring doped regions by insulating structures such as shallow trench isolations.

With reference to FIG. 1, the plurality of first conductive features 109 may be disposed in the first insulating layer 103 (only three first conductive features 109 are shown in FIG. 1 for clarity). The plurality of first conductive features 109 may include, for example, conductive lines, conductive vias, and conductive contacts. The conductive via may connect adjacent conductive lines along the direction Z. The conductive vias may improve heat dissipation in the first insulating layer 103 and provide structural support in the first insulating layer 103. In some embodiments, the plurality of first device elements 105 may be interconnected through the plurality of first conductive features 109. In the embodiment depicted, some of the plurality of first conductive features 109 may be disposed adjacent to the top surface of the first insulating layer 103. The top surfaces of the some of the plurality of first conductive features 109 may be substantially coplanar with the top surface of the first insulating layer 103. The plane consisting of the top surface of the first insulating layer 103 and the top surfaces of the some of the plurality of first conductive features 109 may be referred to as the top surface of the first semiconductor structure 100.

With reference to FIG. 1, the barrier layers 111 of the first semiconductor structure 100 may be disposed between the plurality of first conductive features 109 and the first insulating layer 103. Each of the barrier layers 111 of the first semiconductor structure 100 may cover sidewalls and a bottom surface of a corresponding one of the plurality of first conductive features 109. Some of the barrier layers 111 of the first semiconductor structure 100 may be disposed between some of the plurality of first conductive features 109. For example, one of the barrier layers 111 of the first semiconductor structure 100 may be disposed between a conductive line and a conductive via that are adjacent to each other.

The plurality of first conductive features 109 may be formed of, for example, copper, aluminum, titanium, the like, or a combination thereof. The conductive lines, the conductive vias, and the conductive contacts may be formed of different materials, but are not limited thereto. The barrier layers 111 of the first semiconductor structure 100 may be formed of, for example, titanium nitride, tantalum nitride, titanium, tantalum, titanium tungsten, the like, or a combination thereof.

With reference to FIG. 1, the second semiconductor structure 300 may be disposed opposite to the first semiconductor structure 100 with the first connecting structure 200 interposed therebetween. The first semiconductor structure 100 and the second semiconductor structure 300 may provide different functionalities. For example, the first semiconductor structure 100 may provide a logic function and the second semiconductor structure 300 may provide a memory function. In some embodiments, the first semiconductor structure 100 and the second semiconductor structure 300 may provide the same functionality.

With reference to FIG. 1, the second semiconductor structure 300 may have a structure similar to that of the first semiconductor structure 100. The second semiconductor structure 300 may include a second substrate 301, a second insulating layer 303, a plurality of second device elements 305, a plurality of second doped regions 307, a plurality of second conductive features 309, and barrier layers 311 of the second semiconductor structure 300.

With reference to FIG. 1, the second substrate 201 may be disposed opposite to the first connecting structure 200 with the second insulating layer 303 interposed therebetween. The second substrate 301 has a structure similar to that of the first substrate 101, but is not limited thereto. The second substrate 301 may be formed of a same material as the first substrate 101, but is not limited thereto. The second insulating layer 303 may have a structure similar to that of the first insulating layer 103, but is not limited thereto.

With reference to FIG. 1, the plurality of second device elements 305 may be disposed adjacent to an upper portion of the second insulating layer 303 (only two second device elements 305 are shown in FIG. 1 for clarity). The plurality of second device elements 305 may be, for example, bipolar junction transistors, metal-oxide-semiconductor field-effect transistors, diodes, flash memories, dynamic random-access memories, static random-access memories, electrically erasable programmable read-only memories, image sensors, micro-electro-mechanical systems, active devices, or passive devices. The plurality of second doped regions 307 may be disposed in the second substrate 301 and respectively correspondingly adjacent to two sides of the plurality of second device elements 305 (only two second doped regions 307 are shown in FIG. 1 for clarity). In some embodiments, the plurality of second doped regions 307 may be electrically insulated from neighboring doped regions by insulating structures such as shallow trench isolations.

With reference to FIG. 1, the plurality of second conductive features 309 may be disposed in the second insulating layer 303. The plurality of second conductive features 309 may have structures similar to those of the plurality of first conductive features 109. In some embodiments, the plurality of second device elements 305 may be interconnected through the plurality of second conductive features 309.

In some embodiments, some of the plurality of second conductive features 309 may be disposed adjacent to the bottom surface of the second insulating layer 303. Bottom surfaces of some of the plurality of second conductive features 309 and the bottom surface of the second insulating layer 303 may be substantially coplanar. The plane consisting of the bottom surface of the second insulating layer 303 and the bottom surfaces of the some of the plurality of second conductive features 309 may be referred to as the bottom surface of the first connecting structure 200. The barrier layers 311 of the second semiconductor structure 300 may be disposed between the plurality of second conductive features 309 and the second insulating layer 303. Some of the barrier layers 311 of the second semiconductor structure 300 may be disposed between some of the plurality of second conductive features 309.

With reference to FIG. 1, the first connecting structure 200 may be disposed between the first semiconductor structure 100 and the second semiconductor structure 300. The first connecting structure 200 may include a first connecting insulating layer 201, a plurality of first conductive layers 207, a plurality of first bottom liners 209, a plurality of first top liners 211, and barrier layers 215 of the first connecting structure 200.

With reference to FIG. 1, the first connecting insulating layer 201 may be disposed on the top surface of the first insulating layer 103. The first connecting insulating layer 201 may include a first bottom insulating layer 203 and a first top insulating layer 205. The first bottom insulating layer 203 may be disposed on the top surface of the first insulating layer 103. The first bottom insulating layer 203 may be formed of, for example, silicon oxide, silicon nitride, silicon oxynitride, silicon oxide nitride, polyimide, polybenzoxazole, or a combination thereof. In the embodiment depicted, the first bottom insulating layer 203 may be formed of silicon oxide. The first top insulating layer 205 may be disposed on the first bottom insulating layer 203. The first top insulating layer 205 may be formed of, for example, silicon oxide, silicon nitride, silicon oxynitride, silicon oxide nitride, polyimide, polybenzoxazole, or a combination thereof. In the embodiment depicted, the first bottom insulating layer 203 may be formed of silicon nitride. In some embodiments, the first bottom insulating layer 203 and the first top insulating layer 205 may be formed of a same material.

It should be noted that, in the present disclosure, silicon oxynitride refers to a substance which contains silicon, nitrogen and oxygen and in which a proportion of oxygen is greater than that of nitrogen. Silicon nitride oxide refers to a substance which contains silicon, oxygen and nitrogen and in which a proportion of nitrogen is greater than that of oxygen.

With reference to FIG. 1, the plurality of first conductive layers 207 may be disposed in the first connecting insulating layer 201 (only two first conductive layers 207 are shown for clarity). Each of the first conductive layers 207 may electrically connect one of the second conductive features 309 to one of the first conductive features 109. Bottom surfaces of the plurality of first conductive layers 207 may be connected to the top surfaces of the plurality of first conductive features 109 disposed adjacent to the top surface of the first insulating layer 103. Top surfaces of the plurality of first conductive layers 207 may be connected to the bottom surfaces of the plurality of second conductive features 309 disposed adjacent to the bottom surface of the second insulating layer 303. The plurality of first conductive layers 207 may be formed of, for example, copper, aluminum, titanium, tungsten, cobalt, the like, or a combination thereof.

With reference to FIG. 1, each of the plurality of first conductive layers 207 may include a first portion 207-1 and a second portion 207-3. The first portion 207-1 of the first conductive layer 207 may be disposed on one of the plurality of first conductive features 109 disposed adjacent to the top surface of the first insulating layer 103. In other words, a bottom surface of the first portion 207-1 of the first conductive layer 207 may be connected to the top surface of a corresponding one of the plurality of first conductive features 109 disposed adjacent to the top surface of the first insulating layer 103. The bottom surface of the first portion 207-1 of the first conductive layer 207 may be referred to as the bottom surface of the first conductive layer 207. The first portion 207-1 of the first conductive layer 207 may penetrate through the first bottom insulating layer 203 and extend into the first top insulating layer 205.

With reference to FIG. 1, the second portion 207-3 of the first conductive layer 207 may be disposed on the first portion 207-1 of the first conductive layer 207. A bottom portion of the second portion 207-3 of the first conductive layer 207 may be disposed in the first top insulating layer 205 and a top portion of the second portion 207-3 of the first conductive layer 207 may protrude from the top surface of the first top insulating layer 205. A top surface of the second portion 207-3 of the first conductive layer 207 may be connected to the bottom surface of a corresponding one of the plurality of second conductive features 309. The top surface of the second portion 207-3 of the first conductive layer 207 may be referred to as the top surface of the first conductive layer 207.

With reference to FIG. 1, a plurality of first porous layers 213 may be respectively correspondingly disposed between adjacent pairs of the plurality of first conductive layers 207 (only one first porous layer 213 is shown for clarity). The plurality of first porous layers 213 may penetrate the first top insulating layer 205 and extend into the first bottom insulating layer 203. Bottom surfaces of the plurality of first porous layers 213 may be at a vertical level higher than a vertical level of the top surface of the first insulating layer 103.

The plurality of first porous layers 213 may be formed from an energy-removable material. Each of the plurality of first porous layers 213 may include a skeleton and a plurality of empty spaces disposed among the skeleton. The plurality of empty spaces may be connected to each other and may be filled with air. The skeleton may include, for example, silicon oxide, low-dielectric materials, or methylsilsesquioxane. Each of the plurality of first porous layers 213 may have a porosity between 25% and 100%. It should be noted that, when the porosity is 100%, it means the plurality of first porous layers 213 includes only empty spaces and the plurality of first porous layers 213 may be regarded as air gaps. In some embodiments, the porosity of the plurality of first porous layers 213 may be between 45% and 95%. The plurality of empty spaces of the plurality of first porous layers 213 may be filled with air. As a result, a dielectric constant of the plurality of first porous layers 213 may be significantly lower than a dielectric constant of a layer formed of, for example, only silicon oxide. Therefore, the plurality of first porous layers 213 may significantly reduce the parasitic capacitance between the adjacent pairs of the plurality of first conductive layers 207. That is, the plurality of first porous layers 213 may significantly alleviate an interference effect between electrical signals induced in or applied to the first connecting structure 200.

The energy-removable material may include a material such as a thermal-decomposable material, a photonic-decomposable material, an e-beam decomposable material, or a combination thereof. For example, the energy-removable material may include a base material and a decomposable porogen material that is sacrificially removed upon being exposed to an energy source.

With reference to FIG. 1, the plurality of first top liners 211 may be disposed on the first top insulating layer 205. The plurality of first top liners 211 may be disposed surrounding the top portions of the second portions 207-3 of the plurality of first conductive layers 207. Top surfaces of the plurality of first top liners 211 and the top surfaces of the plurality of first conductive layers 207 may be substantially coplanar. The plane consisting of the top surfaces of the plurality of first top liners 211 and the top surfaces of the plurality of first conductive layers 207 may be referred to as the top surface of the first connecting structure 200. The plurality of first top liners 211 may be formed of, for example, silicon oxide, silicon nitride, silicon oxynitride, silicon nitride oxide, the like, or a combination thereof. In the embodiment depicted, the plurality of first top liners 211 may be formed of silicon nitride. The plurality of first top liners 211 may serve as a protection layer for the first connecting structure 200.

With reference to FIG. 1, the plurality of first bottom liners 209 may be disposed between the plurality of first top liners 211 and the first top insulating layer 205, between the plurality of first porous layers 213 and the first top insulating layer 205, between the plurality of first porous layers 213 and the first bottom insulating layer 203, between the first top insulating layer 205 and the first portions 207-1 of the plurality of first conductive layers 207, and between the first bottom insulating layer 203 and the first portions 207-1 of the plurality of first conductive layers 207. Bottom surfaces of the plurality of first bottom liners 209 may be at a vertical level higher than the vertical level of the top surface of the first insulating layer 103. The plurality of first bottom liners 209 may be formed of, for example, silicon oxide, silicon nitride, silicon oxynitride, silicon nitride oxide, the like, or a combination thereof. In the embodiment depicted, the plurality of first bottom liners 209 may be formed of silicon oxide. The plurality of first bottom liners 209 may improve adhesion between the aforementioned elements.

With reference to FIG. 1, the barrier layers 215 of the first connecting structure 200 may be disposed between the plurality of first top liners 211 and the second portions 207-3 of the plurality of first conductive layers 207, between the plurality of first bottom liners 209 and the second portions 207-3 of the plurality of first conductive layers 207, between the first top insulating layer 205 and the second portions 207-3 of the plurality of first conductive layers 207, between the first bottom insulating layer 203 and the first portions 207-1 of the plurality of first conductive layers 207, and between the first portions 207-1 of the plurality of first conductive layer 207 and the plurality of first conductive features 109 disposed adjacent to the top surface of the first insulating layer 103. The barrier layers 215 of the first connecting structure 200 may have a thickness between about 10 angstroms and about 15 angstroms. In some embodiments, the barrier layers 215 of the first connecting structure 200 may have a thickness between about 11 angstroms and about 13 angstroms. The barrier layers 215 of the first connecting structure 200 may be formed of, for example, titanium nitride, tantalum nitride, titanium, tantalum, titanium tungsten, the like, or a combination thereof.

The barrier layers 215 of the first connecting structure 200 may serve as adhesive layers between the aforementioned elements.

With reference to FIG. 1, the through substrate via 405 may be disposed in the second substrate 301 and may be electrically connected to one of the plurality of second conductive features 309 or one of the second device elements 305. In some embodiments, the through substrate via 405 may be electrically connected to one of the plurality of first conductive features 109 of the first semiconductor structure 100 through one of the plurality of second conductive features 309. In some embodiments, the through substrate via 405 may be electrically connected to the plurality of first conductive layers 207 through some of the plurality of second conductive features 309. In some embodiments, the through substrate via 405 does not penetrate through the second insulating layer 303. In some embodiments, the through substrate via 405 does not occupy excessive space of the second semiconductor structure 300. Therefore, more second device elements 305 may be disposed in the second semiconductor structure 300 to provide a more sophisticated functional semiconductor device. The through substrate via 405 may be formed of, for example, copper, aluminum, titanium, the like, or a combination thereof.

With reference to FIG. 1, the spacers 407 may be disposed on sidewalls of the through substrate via 405. The spacers 407 may electrically isolate the through substrate via 405 from neighboring conductive elements disposed adjacent to two sides of the through substrate via 405. The bottom passivation layer 401 may be disposed on the second substrate 301. The top passivation layer 403 may be disposed on the bottom passivation layer 401. A redistribution layer 409 may be disposed in the bottom passivation layer 401. A portion of the bottom passivation layer 401 and a top passivation layer 403 may be recessed to expose a portion of a top surface of the redistribution layer 409. The bottom passivation layer 401 and the top passivation layer 403 may be formed of, for example, silicon nitride, silicon oxynitride, silicon oxide nitride, polyimide, polybenzoxazole, or a combination thereof. The bottom passivation layer 401 and the top passivation layer 403 may be formed of different materials, but are not limited thereto. The redistribution layer 409 may be electrically connected to the through substrate via 405. The redistribution layer 409 may be formed of, for example, tungsten, titanium, tin, nickel, copper, gold, aluminum, platinum, cobalt, or a combination thereof.

With reference to FIG. 1, the under bump metallization layer 411 may be disposed on the top passivation layer 403 and the portion of the top surface of the redistribution layer 409. The conductive bump 413 may be disposed on the under bump metallization layer 411 and electrically connected to the redistribution layer 409. The under bump metallization layer 411 may be formed of, for example, chromium, tungsten, titanium, copper, nickel, aluminum, palladium, gold, vanadium, or a combination thereof. The conductive bump 413 may be a solder bump.

The under bump metallization layer 411 may be a single-layer structure or a stacked structure of multiple layers. For example, the under bump metallization layer 411 may include a first metal layer, a second metal layer, and a third metal layer stacked sequentially. The first metal layer may serve as an adhesive layer for stably attaching the under bump metallization layer 411 to the redistribution layer 409 and the top passivation layer 403. For example, the first metal layer may include at least one of titanium, titanium-tungsten, chromium, and aluminum. The second metal layer may serve as a barrier layer for preventing a conductive material contained in the conductive bump 413 from diffusing into the redistribution layer 409 or into the top passivation layer 403. The second metal layer may include at least one of copper, nickel, chromium-copper, and nickel-vanadium. The third metal layer may serve as a seed layer for forming the conductive bump 413 or as a wetting layer for improving wetting characteristics of the conductive bump 413. The third metal layer may include at least one of nickel, copper, and aluminum.

FIGS. 2 to 6 illustrate, in schematic cross-sectional diagrams, semiconductor devices 10B, 10C, 10D, 10E, and 10F in accordance with embodiments of the present disclosure.

Figure 2:
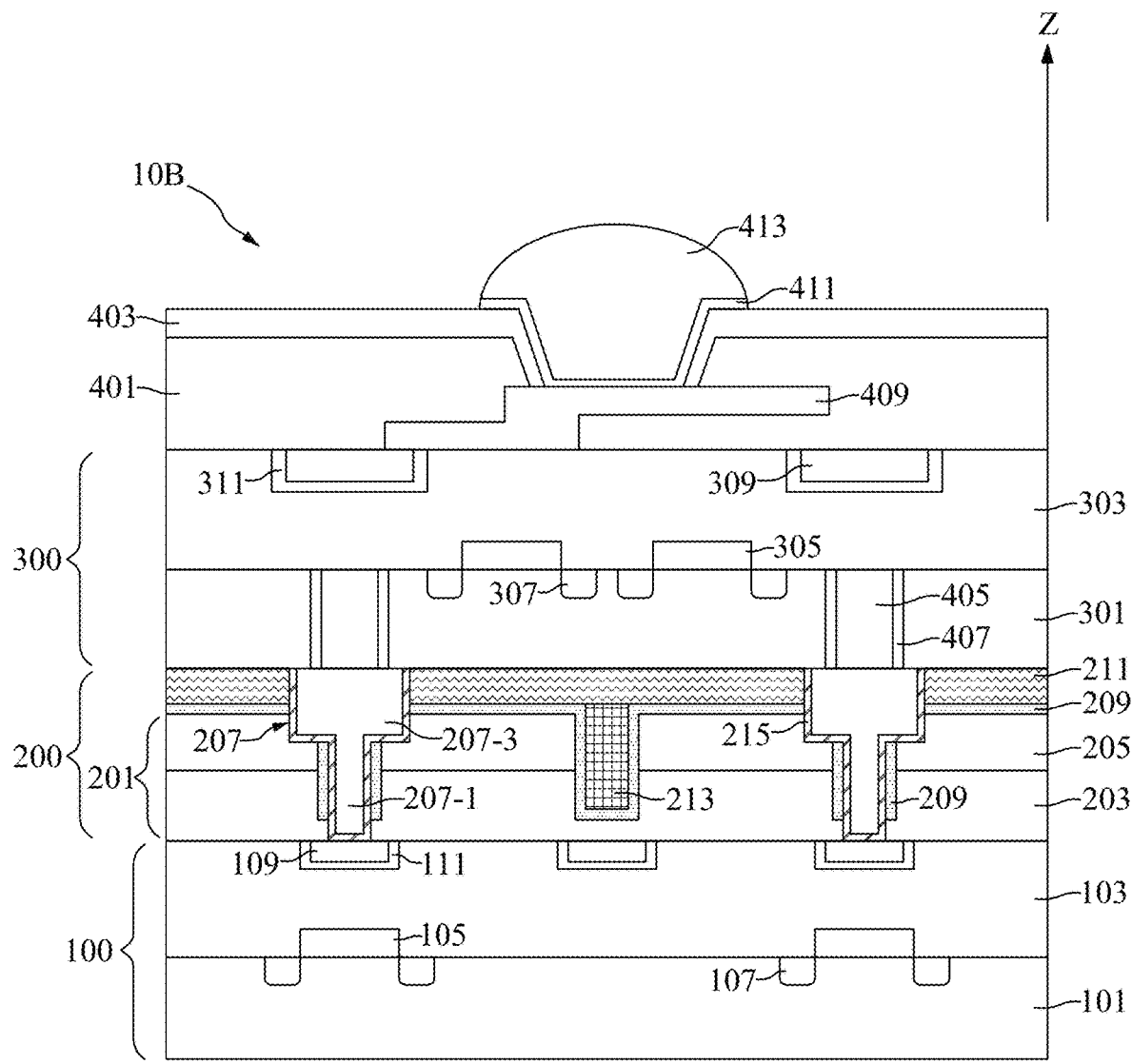
FIGS. 2 to 6 illustrate, in schematic cross-sectional diagrams, semiconductor devices in accordance with embodiments of the present disclosure.

With reference to FIG. 2, in the semiconductor device 10B, the second semiconductor structure 300 may be disposed in a manner similar to that of the first semiconductor structure 100. The second substrate 301 may be disposed on the first connecting structure 200.

The bottom passivation layer 401 may be disposed on the second insulating layer 303. The through substrate vias 405 may be disposed in the second substrate 301. The first semiconductor structure 100 and the second semiconductor structure 300 may be stacked in a "back-to-face" manner.

Figure 3:
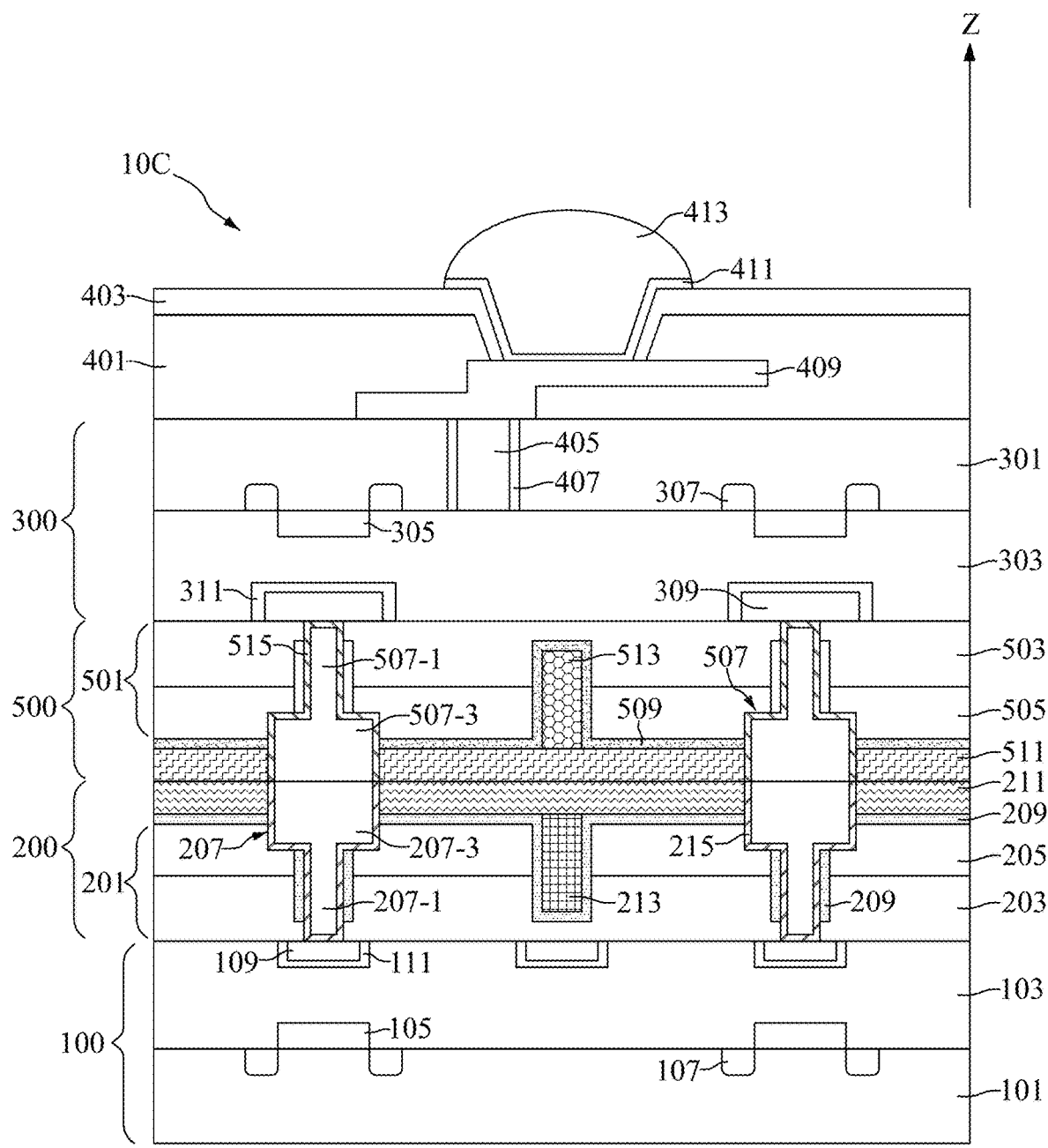

With reference to FIG. 3, in the semiconductor device 10C, a second connecting structure 500 may be disposed between the second semiconductor structure 300 and the first connecting structure 200. The second connecting structure 500 may have a structure similar to that of the first connecting structure 200, but is disposed in an upside-down manner. The second connecting structure 500 may include a second connecting insulating layer 501, a plurality of second conductive layers 507 (only two second conductive layers are shown for clarity), a plurality of second bottom liners 509, a plurality of second top liners 511, and a plurality of second porous layers 513 (only one second porous layer 513 is shown for clarity). The second connecting insulating layer 501 may include a second bottom insulating layer 503 and a second top insulating layer 505. The second top insulating layer 505 may be disposed on the first connecting structure 200. The second bottom insulating layer 503 may be disposed on the second top insulating layer 505.

With reference to FIG. 3, the plurality of second conductive layers 507 may be disposed on the plurality of first conductive layers 207 and below the plurality of second conductive features 309 disposed adjacent to the bottom surface of the second insulating layer 303. Each of the plurality of second conductive layers 507 may include a first portion 507-1 and a second portion 507-3. The plurality of second portions 507-3 may be respectively correspondingly disposed on the plurality of first conductive layers 207. The first portion 507-1 may be disposed on the second portion 507-3. The plurality of second porous layers 513 may be disposed between adjacent pairs of the plurality of second conductive layers 507. The plurality of second porous layers 513 may have a porosity between about 25% and about 100%. The plurality of second top liners 511 may be disposed between the second top insulating layer 505 and the plurality of first top liners 211. The plurality of second bottom liners 509 may be disposed on sidewalls of the plurality of second porous layers 513, on the top surfaces of the plurality of second porous layers 513, on the sidewalls of the first portions 507-1, and between the second top insulating layer 505 and the plurality of second top liners 511.

Figure 4:
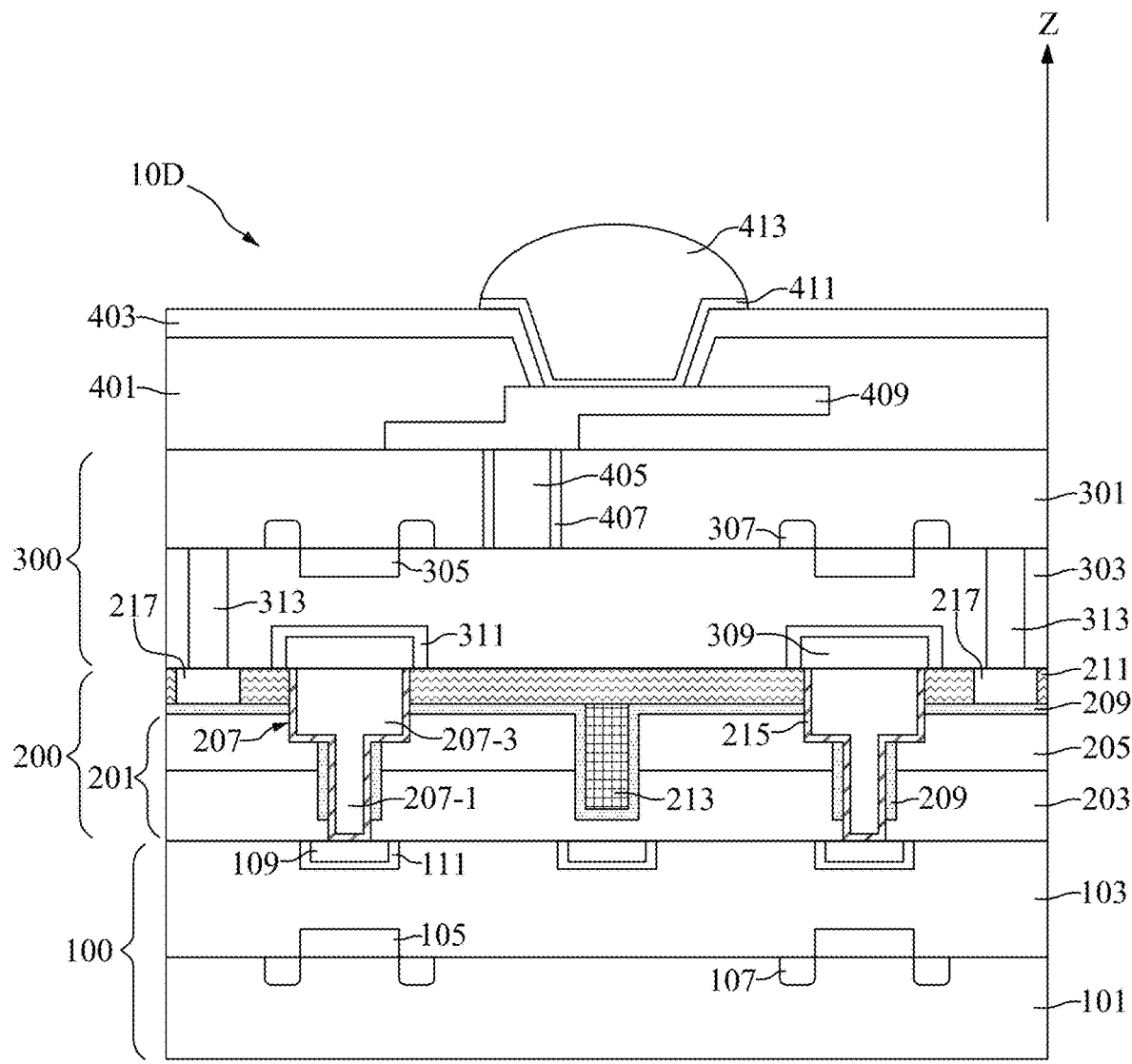

With reference to FIG. 4, in the semiconductor device 10D, the second semiconductor structure 300 may include a plurality of guard rings 313. The plurality of guard rings 313 may consist of some of the plurality of second conductive features 309 electrically connected. The plurality of guard rings 313 may be dummy patterns. The plurality of guard rings 313 may have a same thickness as the second insulating layer 303. In other words, the plurality of guard rings 313 may penetrate the second insulating layer 303 along the direction Z. The plurality of guard rings 313 may facilitate the planarization process during the formation of the plurality of second conductive features 309. The plurality of guard rings 313 may also facilitate a bonding process with another structure such as the first connecting structure 200. Furthermore, the plurality of guard rings 313 may improve the mechanical strength of the second semiconductor structure 300. In some embodiments, the plurality of guard rings 313 may consist of some of the plurality of second conductive features 309 disposed along the direction Z and apart from each other.

It should be noted that referring to an element as a "dummy" element means that the element is electrically insulated from all of the device elements. In addition, when the semiconductor device is in operation, no exterior voltage or current is applied to the element.

With reference to FIG. 4, the first connecting structure 200 may include a plurality of first supporting layers 217. In some embodiments, the plurality of first supporting layers 217 may be respectively correspondingly disposed below the plurality of guard rings 313 and penetrating the plurality of first top liners 211. In some embodiments, the plurality of first supporting layers 217 may be disposed penetrating the plurality of first top liners 211, the plurality of first bottom liners 209, the first top insulating layer 205, and the first bottom insulating layer 203. The plurality of first supporting layers 217 may facilitate a bonding process with the second semiconductor structure 300.

Figure 5:
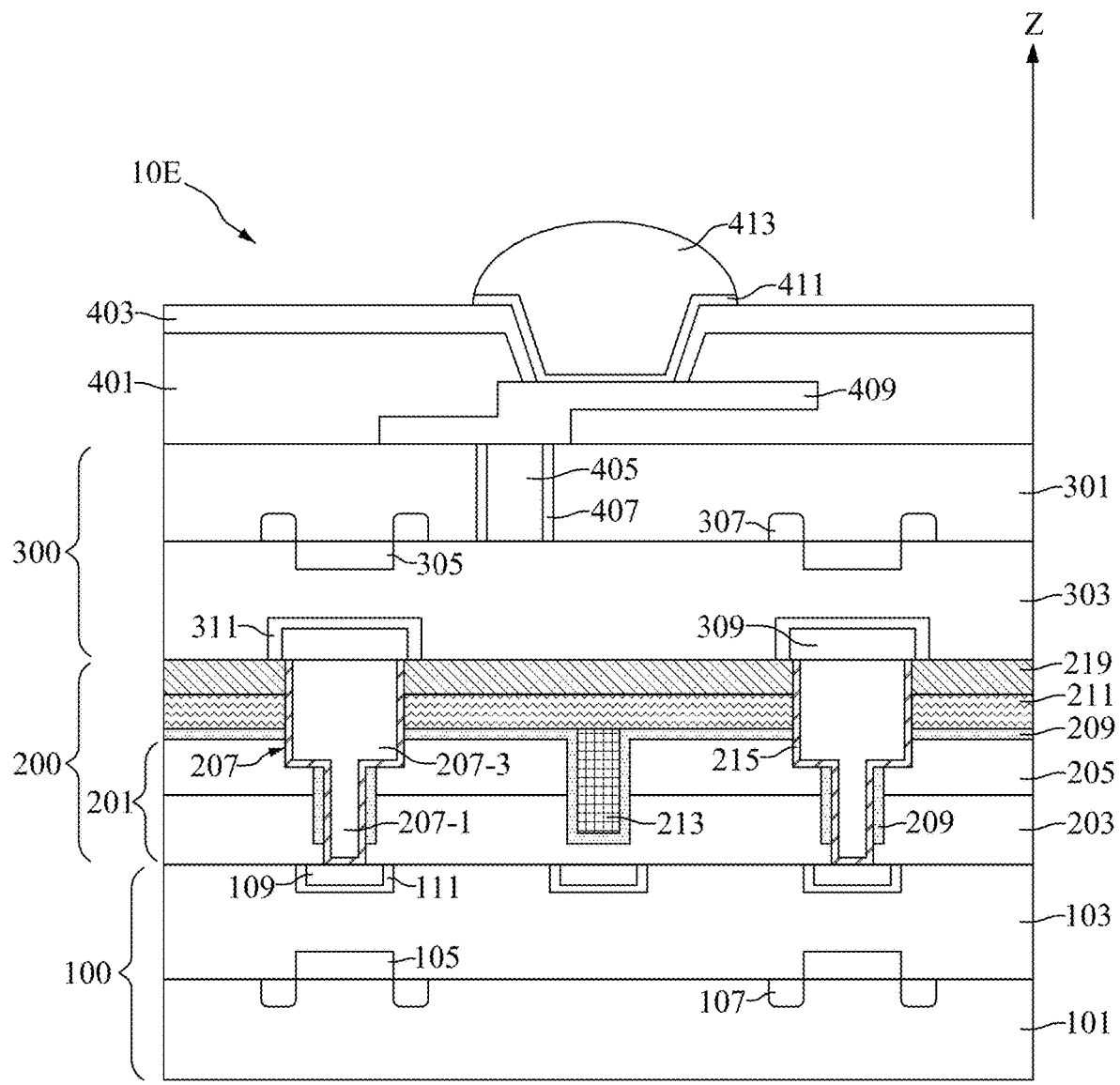

With reference to FIG. 5, in the semiconductor device 10E, a third porous layer 219 may be disposed on the plurality of first top liners 211 and surrounding the second portion 207-3 of the first conductive layer 207. The third porous layer 219 may be formed of a same material as the first porous layer 213. The third porous layer 219 may have a porosity between 25% and 50%.

Figure 6:
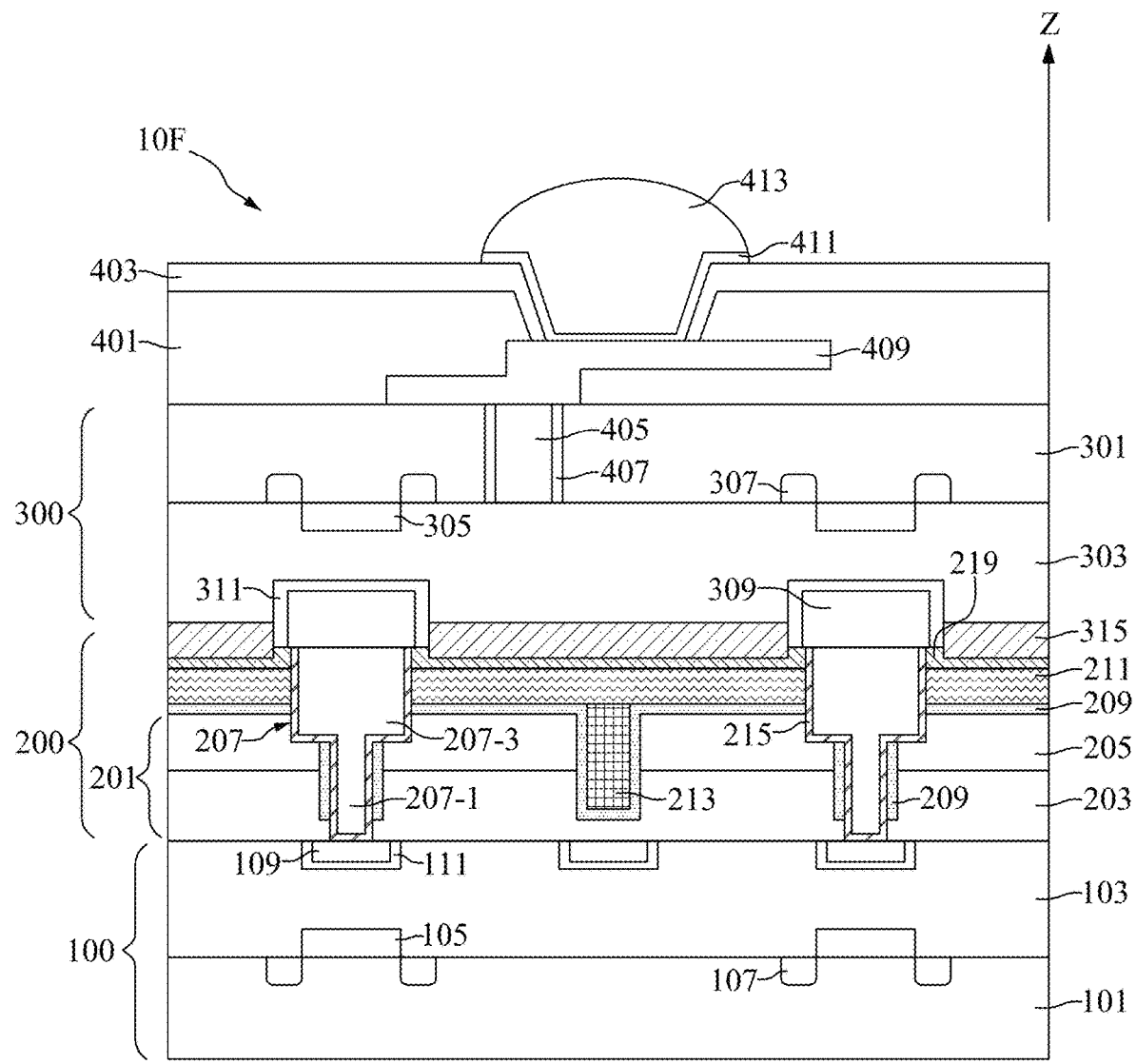

With reference to FIG. 6, in the semiconductor device 10F, the third porous layer 219 may be disposed on the plurality of first top liners 211 and surrounding the second portion 207-3 of the first conductive layer 207. The third porous layer 219 may be formed of a same material as the first porous layer 213. A fourth porous layer 315 may be disposed between the second insulating layer 303 and the third porous layer 219. The fourth porous layer 315 may be formed of a same material as the first porous layer 213. The third porous layer 219 may have a porosity greater than that of the fourth porous layer 315. In some embodiments, the third porous layer 219 may have a porosity between about 50% and about 85%. Step-shaped cross-sectional profiles of the fourth porous layer 315 and the third porous layer 219 may be observed near the bonding interfaces of the plurality of first conductive layers 207 and the plurality of second conductive features 309. The top surfaces of the third porous layer 219 may be substantially coplanar with the top surfaces of the plurality of first conductive layers 207. The top surfaces of the third porous layer 219 may be at a vertical level higher than a vertical level of the bottom surfaces of the fourth porous layer 315.

It should be noted that the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching and wet etching.

Figure 7:
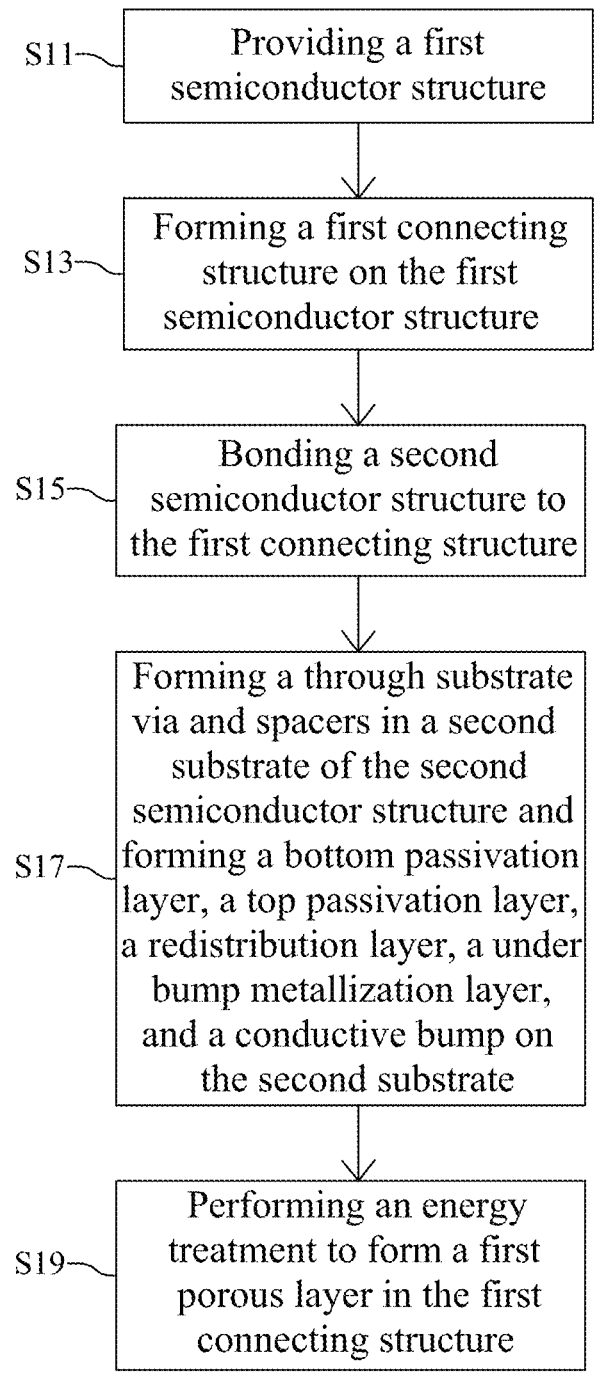
FIG. 7 illustrates, in a flowchart diagram form, a method for fabricating a semiconductor device in accordance with one embodiment of the present disclosure.

FIG. 7 illustrates, in a flowchart diagram form, a method 20 for fabricating a semiconductor device 10A in accordance with one embodiment of the present disclosure. FIGS. 8 to 18 illustrate, in schematic cross-sectional view diagrams, a flow for fabricating the semiconductor device in accordance with one embodiment of the present disclosure.

Figure 8:
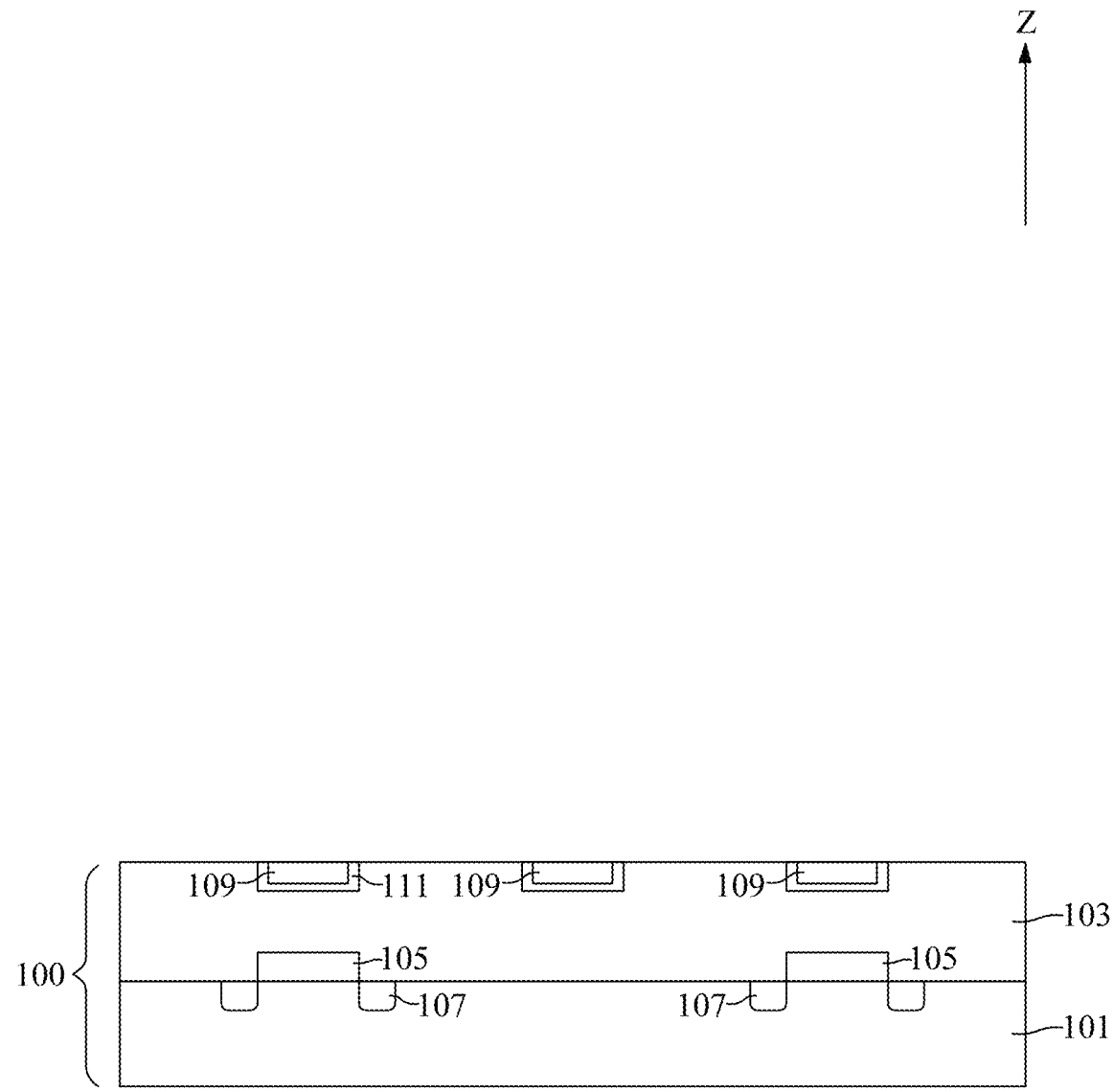
FIGS. 8 to 18 illustrate, in schematic cross-sectional view diagrams, a flow for fabricating the semiconductor device in accordance with one embodiment of the present disclosure.

With reference to FIGS. 7 and 8, at step S11, a first semiconductor structure 100 may be provided. The first semiconductor structure 100 may include a first substrate 101, a first insulating layer 103, a plurality of first device elements 105, a plurality of first doped regions 107, a plurality of first conductive features 109, and barrier layers 111 of the first semiconductor structure 100. The first insulating layer 103 may be formed on the first substrate 101. The plurality of first device elements 105 may be formed in a lower portion of the first insulating layer 105. The plurality of first doped regions 107 may be formed in an upper portion of the first substrate 101 and may be respectively correspondingly formed adjacent to two sides of the plurality of first device elements 105. The plurality of first conductive features 109 may be formed in the first insulating layer 103. The barrier layers 111 of the first semiconductor structure 100 may be formed between the plurality of first conductive features 109 and the first insulating layer 103. The plurality of first device elements 105 and the plurality of first conductive features 109 may be electrically connected.

With reference to FIG. 7 and FIGS. 9 to 16, at step S13, a first connecting structure 200 may be formed on the first semiconductor structure 100. The first connecting structure 200 may include a first connecting insulating layer 201, a plurality of first conductive layers 207, a plurality of first bottom liners 209, a plurality of first top liners 211, a first porous layer 213, and barrier layers 215 of the first connecting structure 200.

Figure 9:
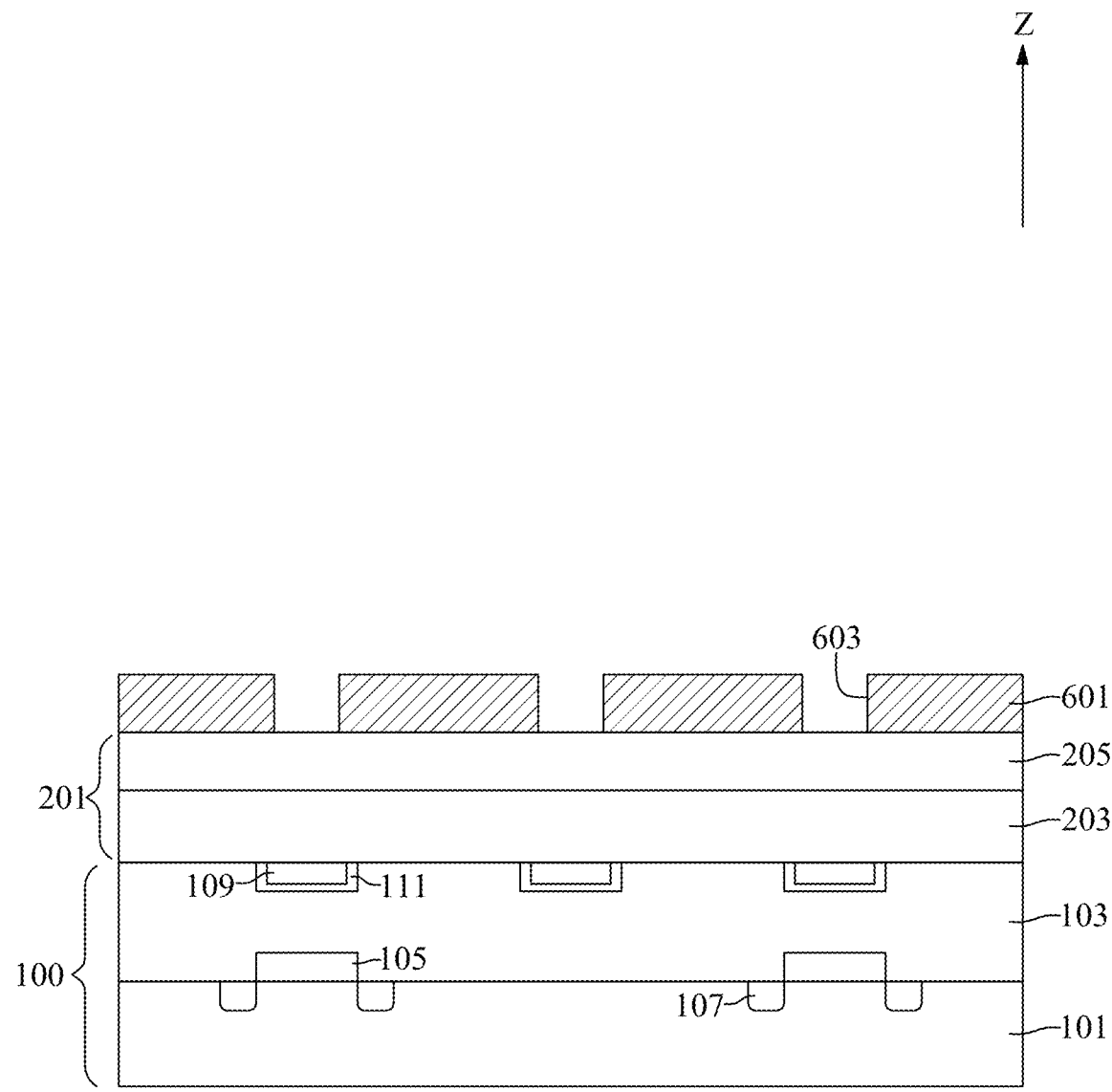

With reference to FIG. 9, the first connecting insulating layer 201 may include a first bottom insulating layer 203 and a first top insulating layer 205. The first bottom insulating layer 203 and the first top insulating layer 205 may be sequentially formed on the first insulating layer 103 by chemical vapor deposition. A first mask layer 601 may be formed on the first top insulating layer 205. In some embodiments, the first mask layer 601 may be a photoresist layer. A development process may be performed to form a plurality of first openings 603 in the first mask layer 601. The plurality of first openings 603 may be formed above the plurality of first conductive features 109 adjacent to the top surface of the first insulating layer 103. In some embodiments, the first mask layer 601 may be a hard mask layer. The plurality of first openings 603 may be formed by performing a photolithography process and a subsequent etch process with a photoresist layer (not shown in FIG. 9) on the hard mask layer.

Figure 10:
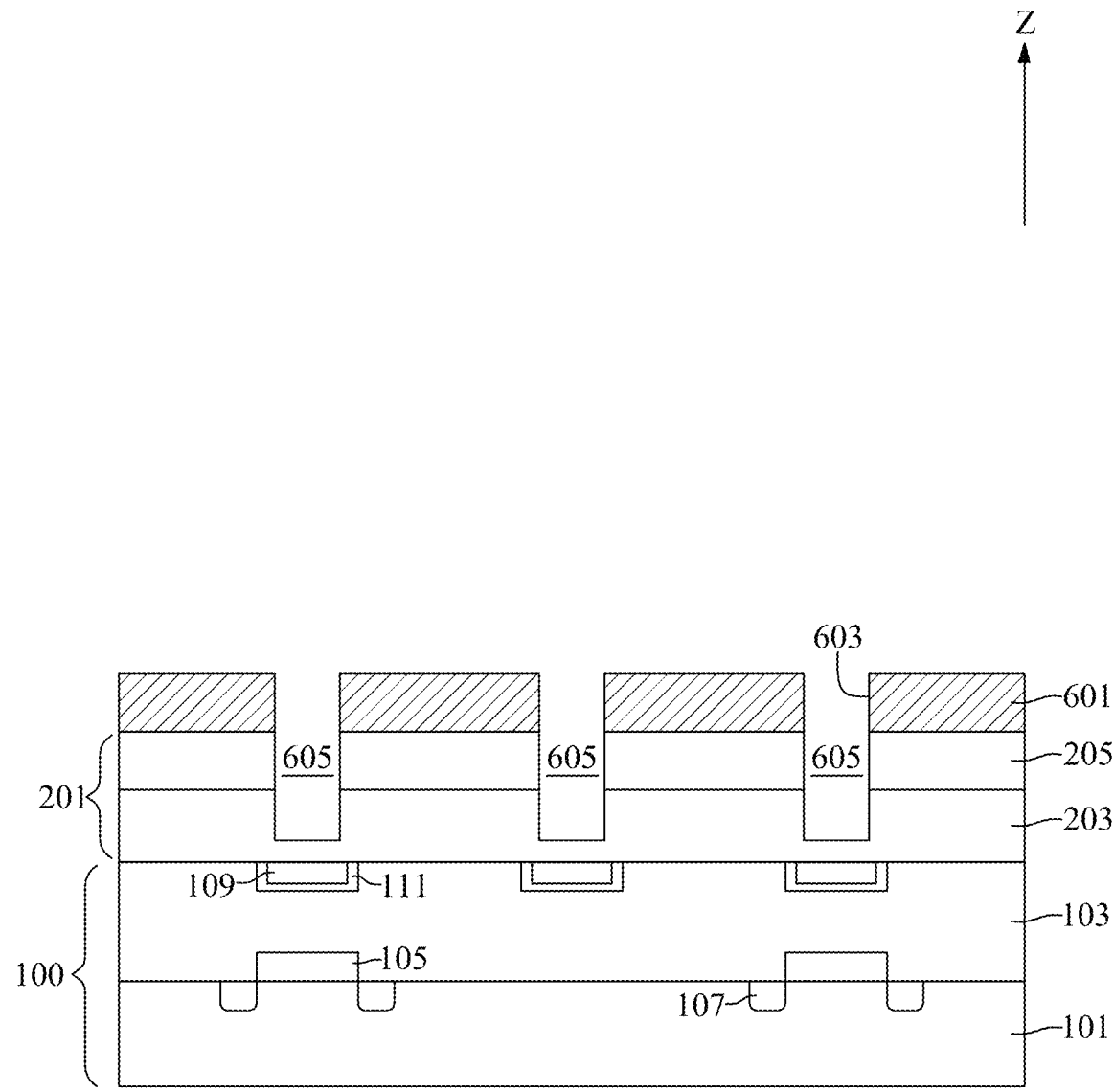

With reference to FIG. 10, an etch process, such as an anisotropic dry etch process, may be performed to remove portions of the first top insulating layer 205 and the first bottom insulating layer 203 and concurrently form a plurality of first trenches 605. The plurality of first trenches 605 may penetrate the first top insulating layer 205 and extend into the first bottom insulating layer 203. After the etch process, the first mask layer 601 may be removed by an ash process, a strip process, or any suitable semiconductor process to remove a mask layer.

Figure 11:
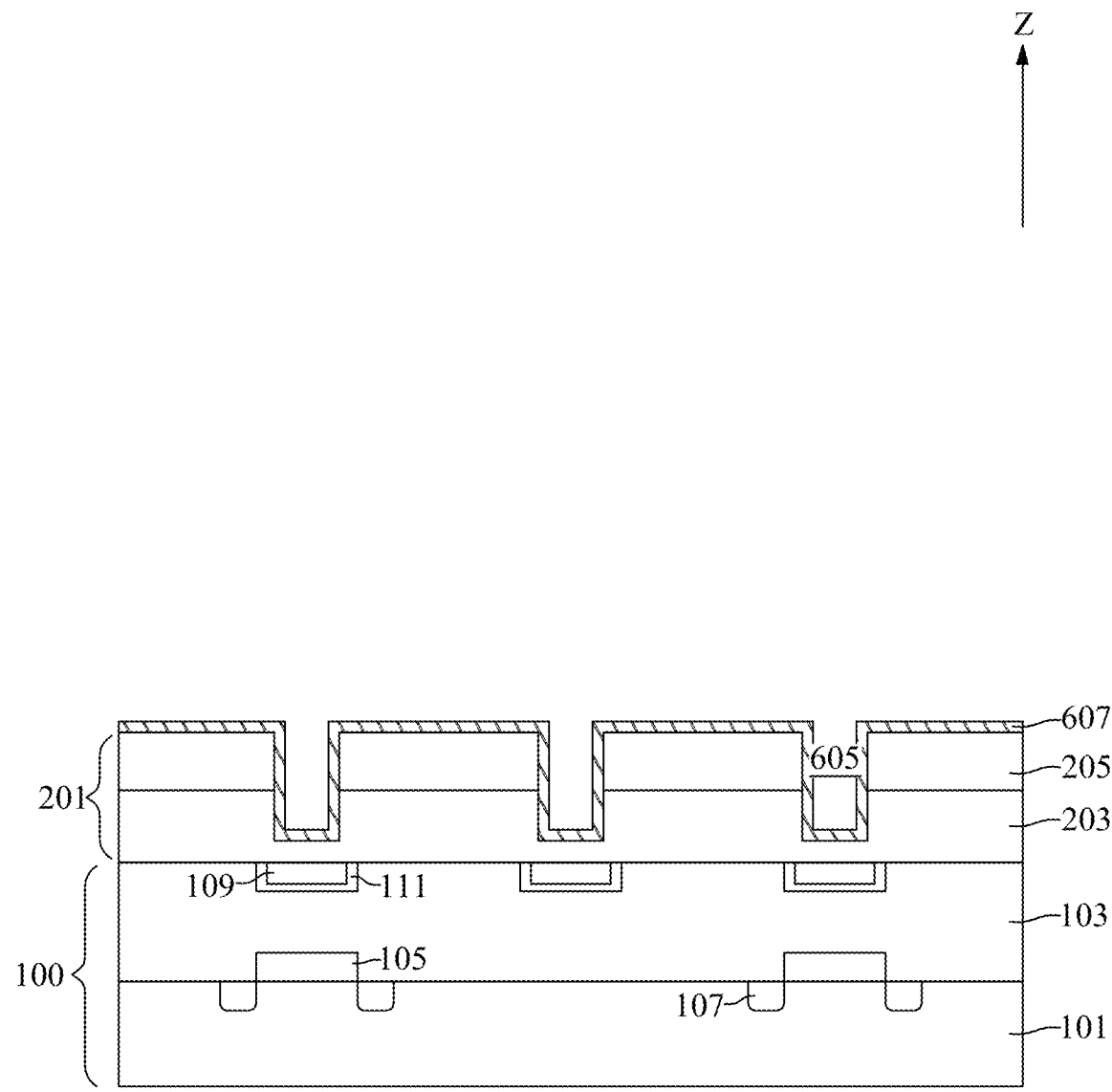

With reference to FIG. 11, a layer of bottom liner material 607 may be formed on the top surfaces of the first top insulating layer 205 and in the plurality of first trenches 605. It should be noted that the plurality of first trenches 605 are not filled by the layer of bottom liner material 607. The bottom liner material 607 may be, for example, silicon oxide, silicon nitride, silicon oxynitride, silicon nitride oxide, the like, or a combination thereof.

Figure 12:
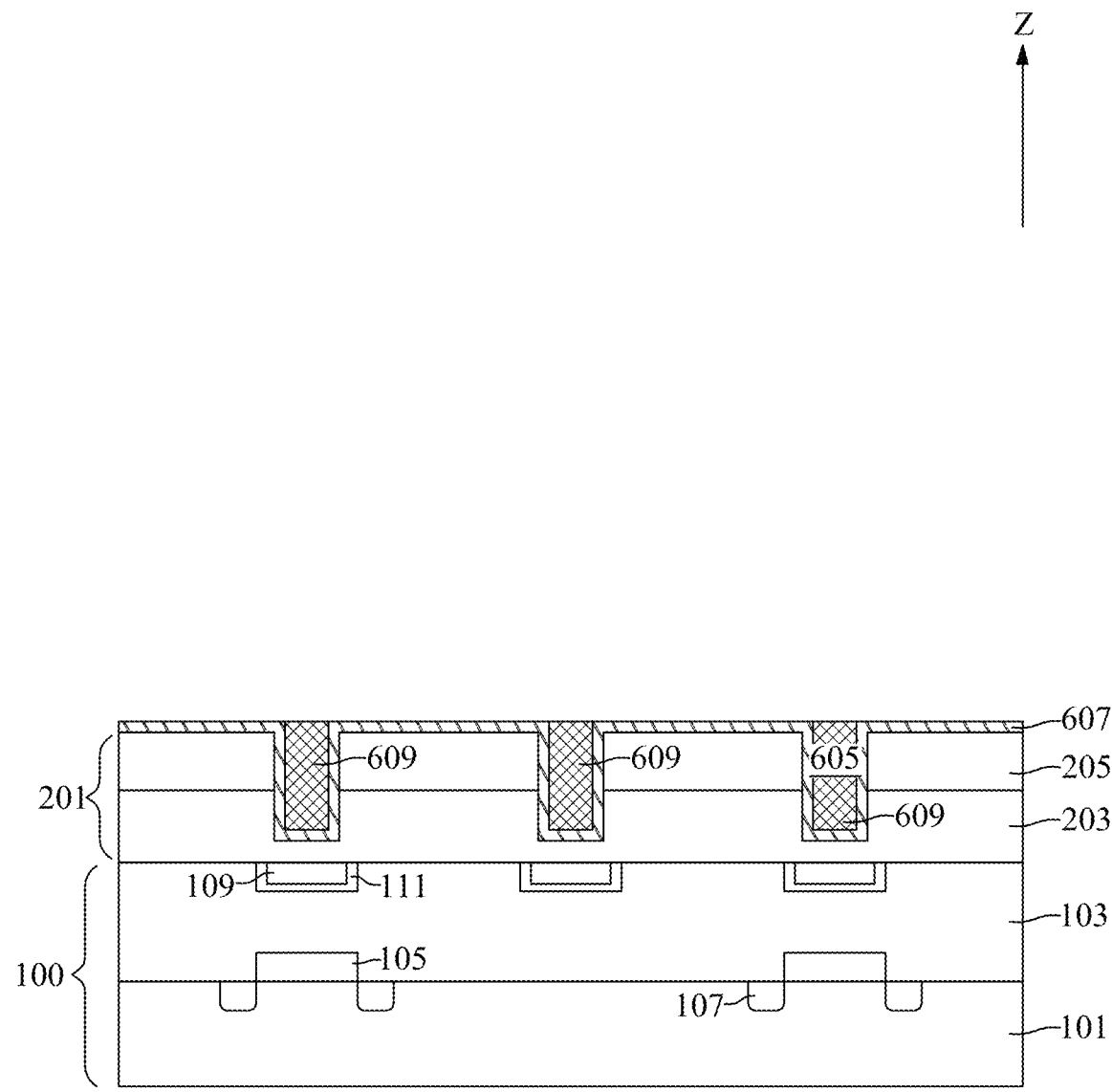

With reference to FIG. 12, an energy-removable material may be formed over the intermediate semiconductor device to fill the plurality of first trenches 605. A planarization process, such as chemical mechanical polishing, may be performed to remove excess material, provide a substantially flat surface for subsequent processing steps, and conformally form a plurality of first energy-removable layers 609 in the plurality of first trenches 605. Top surfaces of the plurality of first energy-removable layers 609 may be substantially coplanar with the top surface of the layer of bottom liner material 607. The plurality of first energy-removable layers 609 may be formed of, for example, an energy-removable material. The energy-removable material may include a material such as a thermal-decomposable material, a photonic-decomposable material, an e-beam decomposable material, or a combination thereof. For example, the energy-removable material may include a base material and a decomposable porogen material that is sacrificially removed upon exposure to an energy source. The base material may include a methylsilsesquioxane based material or silicon oxide. The decomposable porogen material may include a porogen organic compound that provides porosity to the base material of the energy-removable material.

In some embodiments, the energy-removable material may include a relatively high concentration of the decomposable porogen material and a relatively low concentration of the base material, but is not limited thereto. For example, the energy-removable material may include about 75% or greater of the decomposable porogen material, and about 25% or less of the base material. In another example, the energy-removable material may include about 95% or greater of the decomposable porogen material, and about 5% or less of the base material. In another example, the energy-removable material may include about 100% of the decomposable porogen material, and no base material is used. In another example, the energy-removable material may include about 45% or greater of the decomposable porogen material, and about 55% or less of the base material.

Figure 13:
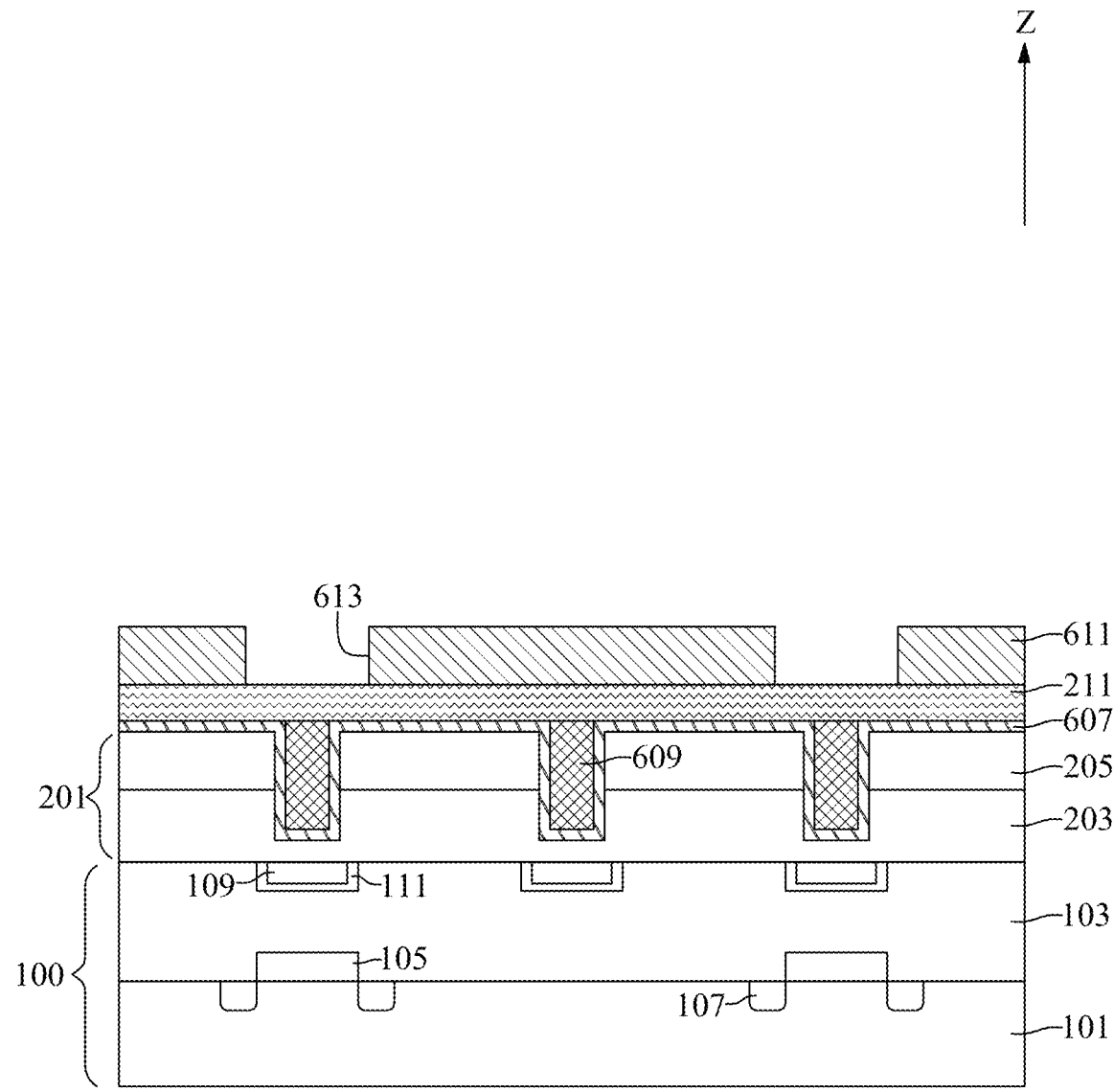

With reference to FIG. 13, a first top liner 211 may be formed on the layer of bottom liner material 607 and the plurality of first energy-removable layers 609. A second mask layer 611 may be formed on the first top liner 211. In some embodiments, a development process may be performed to form a plurality of second openings 613 in the second mask layer 611.

Figure 14:
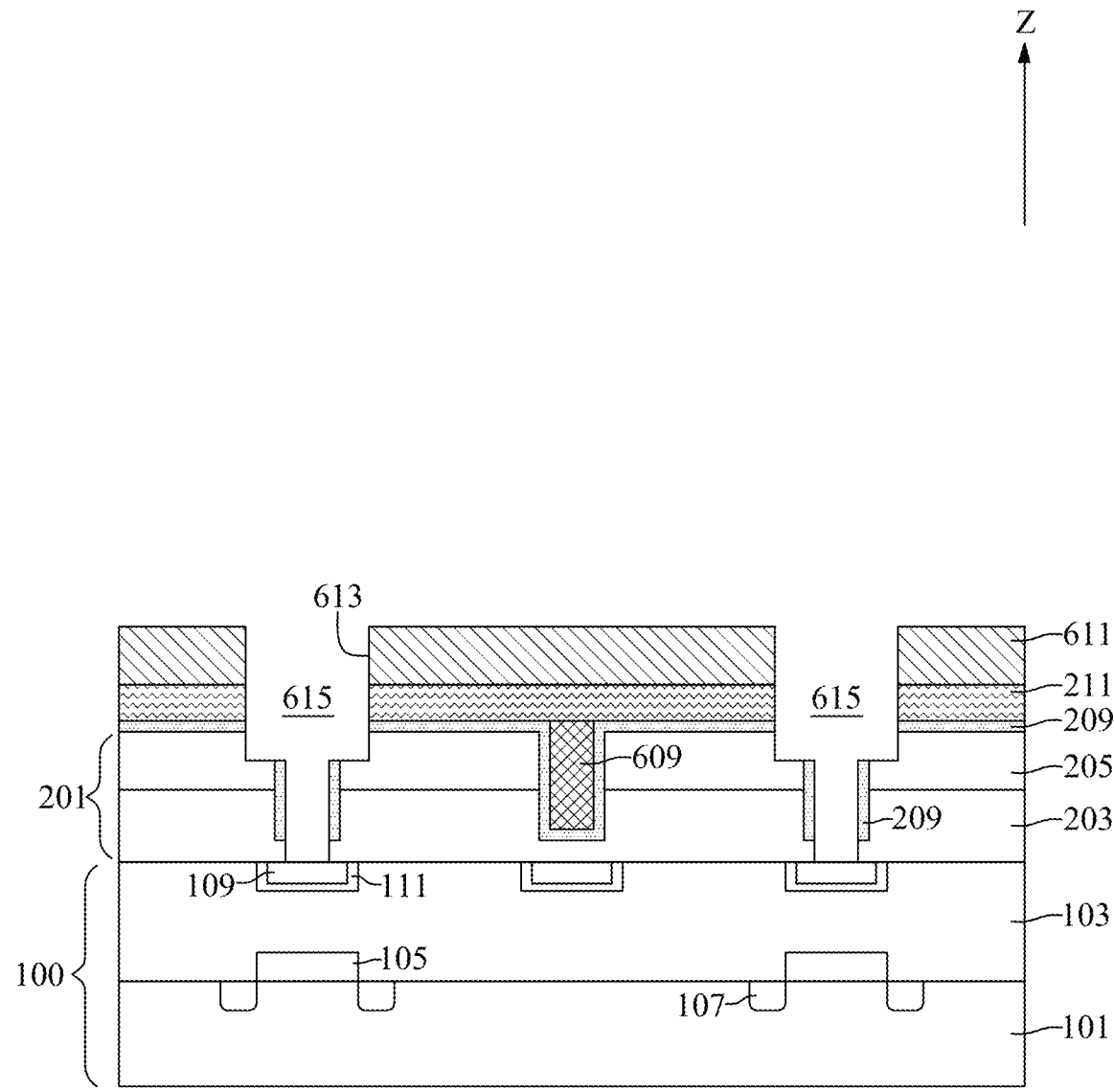

With reference to FIG. 14, an etch process, such as an anisotropic dry etch process, may be performed to remove portions of the first top liner 211, portions of the layer of bottom liner material 607, and portions of the plurality of first energy-removable layers 609, and concurrently form a plurality of second trenches 615. After the etch process, the first top liner 211 may be divided by the plurality of second trenches 615 and turned into a plurality of first top liners 211. The layer of bottom liner material 607 may be turned into the plurality of first bottom liners 209. The etch process may include multiple etching steps using various etching reagents having different etching selectivities. After formation of the plurality of second trenches 615, the second mask layer 611 may be removed. Portions of the top surfaces of the plurality of first conductive features 109 formed adjacent to the top surface of the first insulating layer 103 may be exposed through the plurality of second trenches 615. A remaining first energy-removable layer 609 may be located between an adjacent pair of the plurality of second trenches 615. A width of upper portions of the plurality of second trenches 615 may be greater than a width of lower portions of the plurality of second trenches 615.

Figure 15:
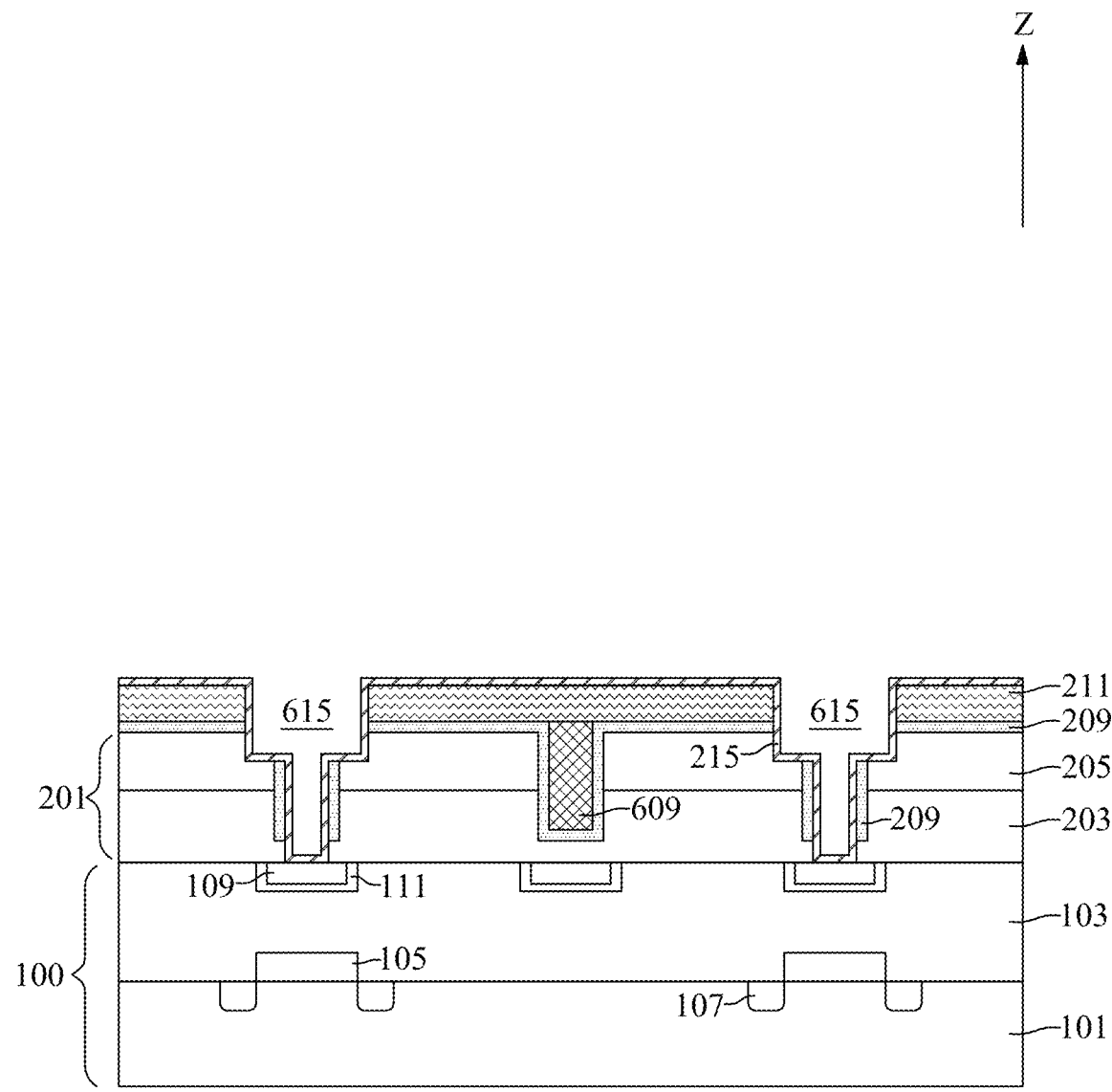
Figure 16:
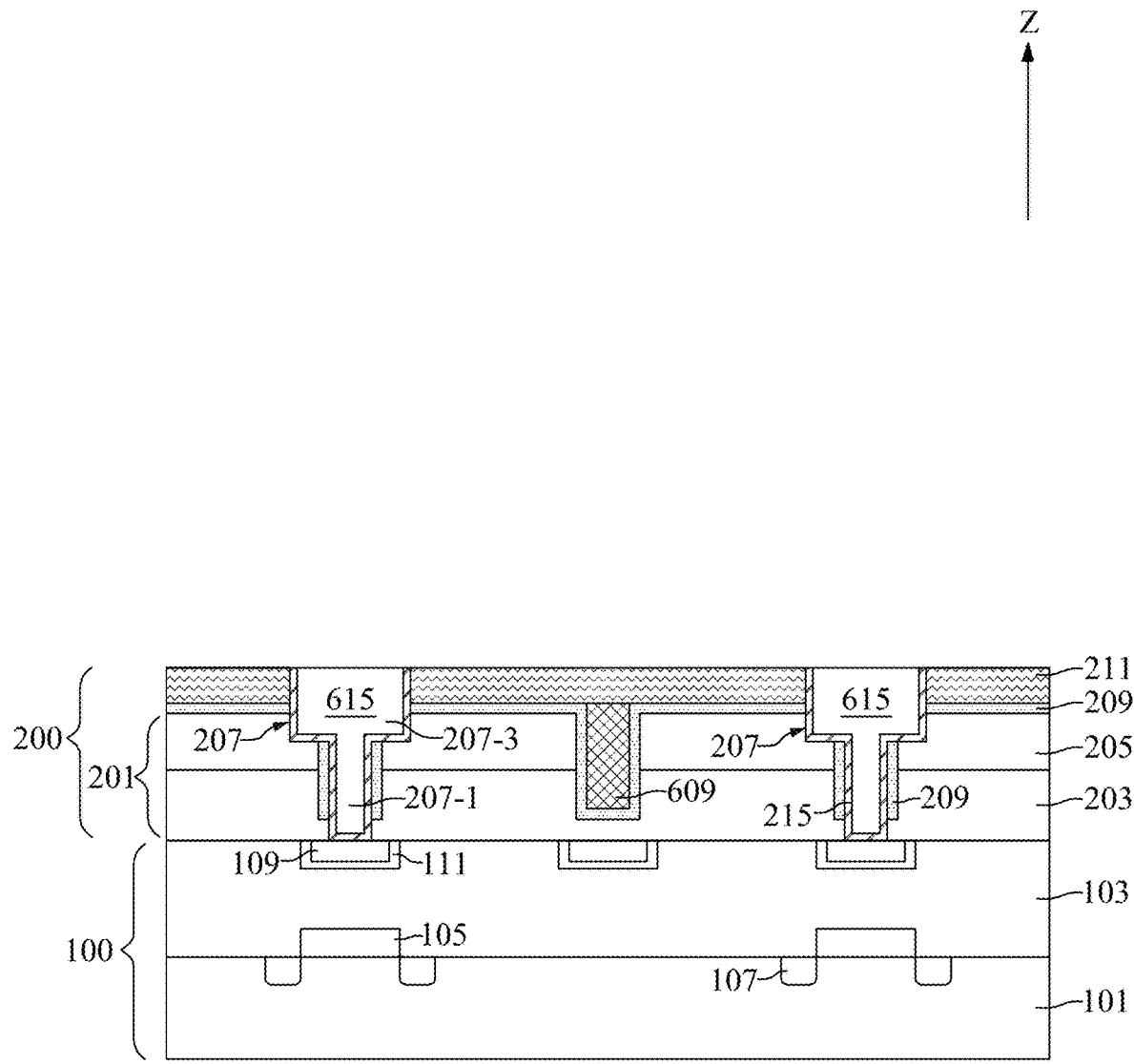

With reference to FIG. 15, a barrier layer 215 may be formed on the top surfaces of the plurality of first top liners 211 and in the plurality of second trenches 615. It should be noted that the plurality of second trenches 615 are not filled by the barrier layer 215. With reference to FIG. 16, a conductive material such as tungsten, copper, cobalt, ruthenium, or molybdenum may be deposited into the plurality of second trenches 615 by a deposition process. After the deposition process, a planarization process, such as chemical mechanical polishing, may be performed to remove excess material, provide a substantially flat surface for subsequent processing steps, and conformally form the plurality of first conductive layers 207.

Figure 17:
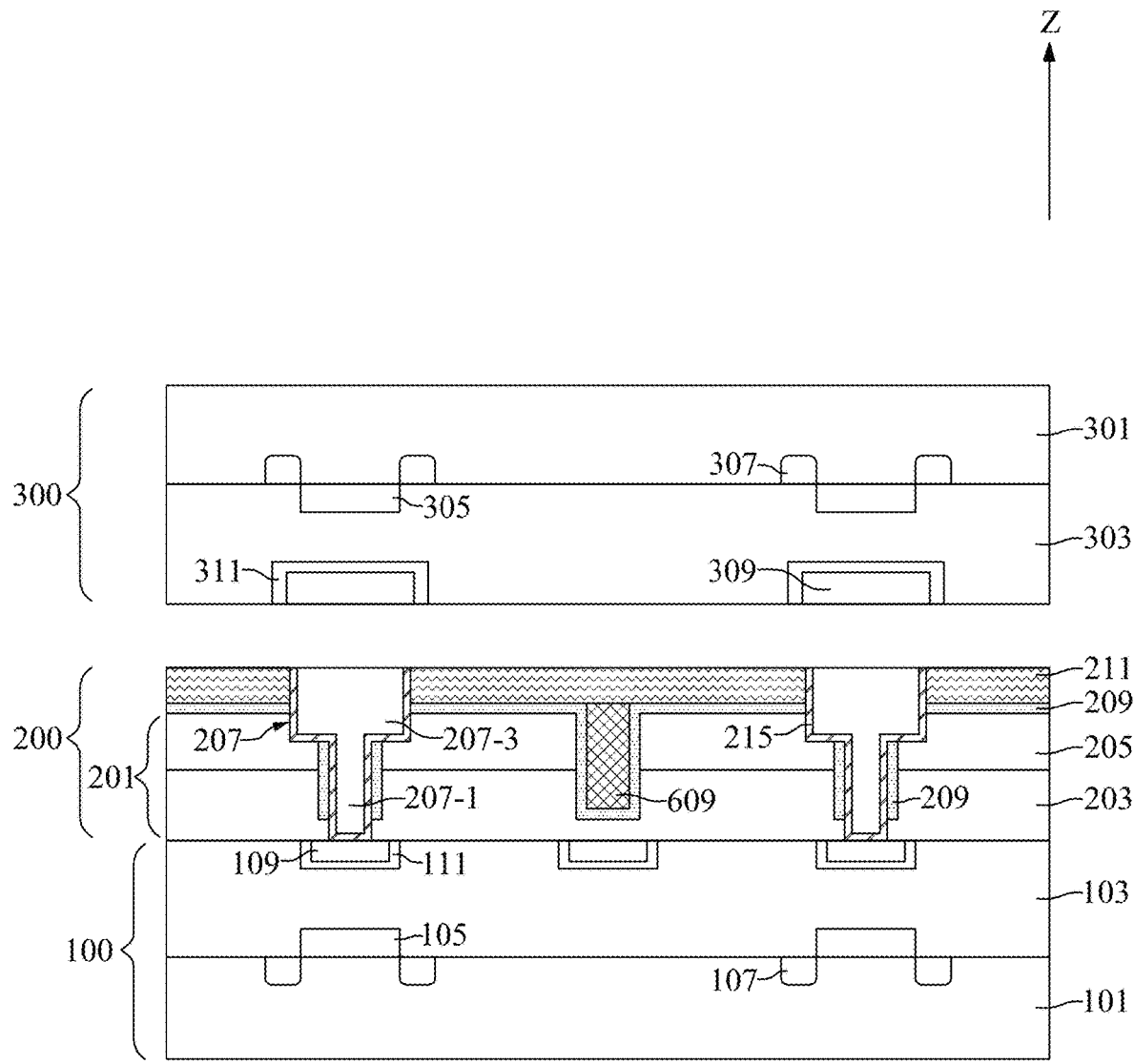
Figure 18:
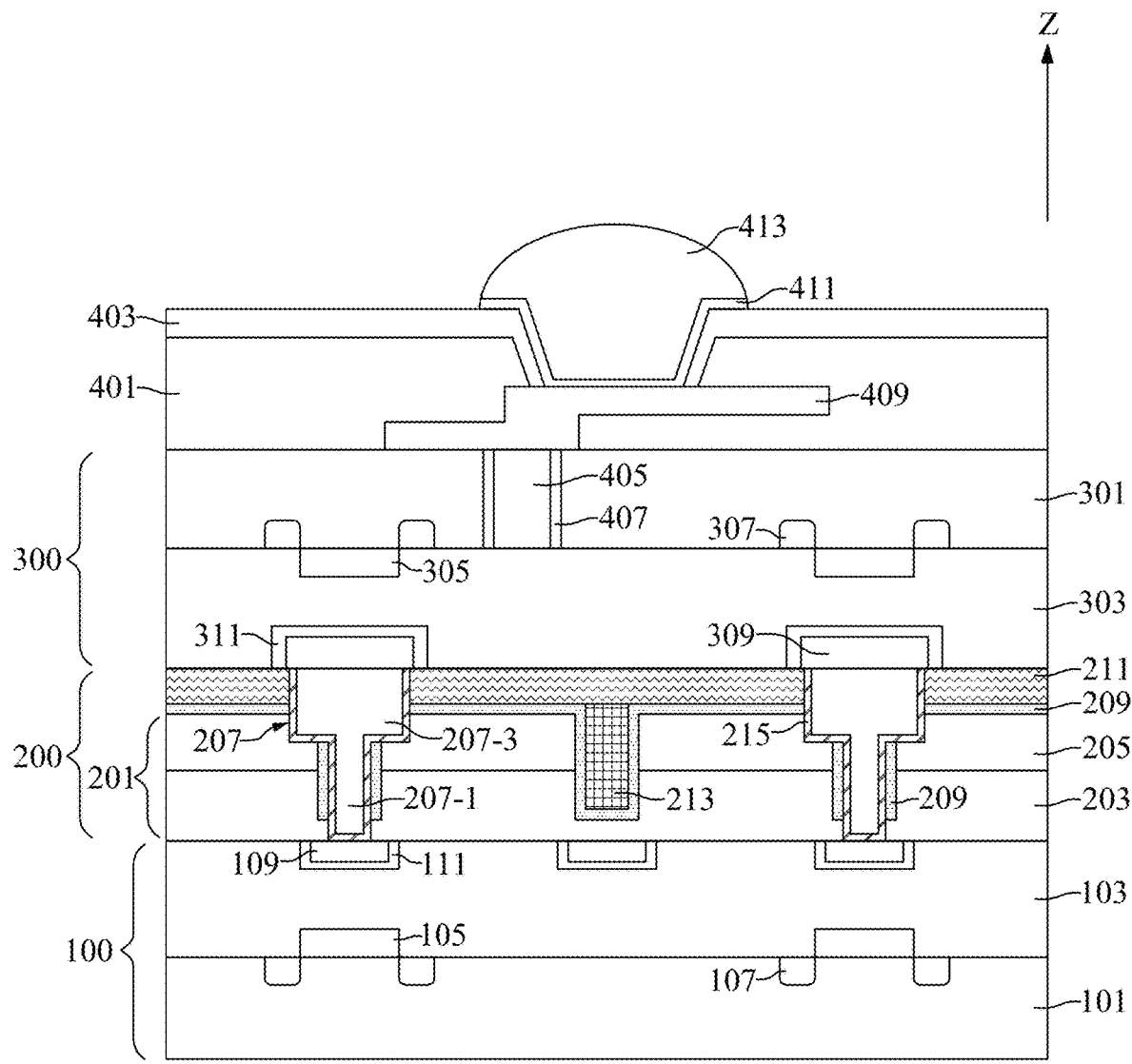

With reference to FIGS. 7, 17, and 18, at step S15, a second semiconductor structure 300 may be bonded to the first connecting structure 200 through a bonding process. With reference to FIG. 17, the second semiconductor structure 300 may be provided. The second semiconductor structure 300 may be formed by a procedure similar to that used to form the first semiconductor structure 100, and the second semiconductor structure may have a structure similar to that of the first semiconductor structure 100. The second semiconductor structure 300 may be disposed in an upside-down manner. The upside-down second semiconductor structure 300 may be disposed on the top surface of the first connecting structure 200. The bonding process may include a thermal treatment performed to achieve a hybrid bonding between elements of the second semiconductor structure 300 and the first connecting structure 200. The hybrid bonding may include a dielectric-to-dielectric bonding and a metal-to-metal bonding. The dielectric-to-dielectric bonding may originate from the bonding between the second insulating layer 303 and the plurality of first top liners 211. The metal-to-metal bonding may originate from the bonding between the plurality of first conductive layers 207 and the plurality of second conductive features 309 formed adjacent to the bottom surface of the second insulating layer 303. A temperature of the bonding process may be between about 300° C. and about 450° C. In some embodiments, a thinning process may be performed on the second substrate 301 using an etching process, a chemical polishing process, or a grinding process to reduce a thickness of the second substrate 301.

With reference to FIGS. 7 and 18, at step S17, a through substrate via 405 and spacers 407 may be formed in the second substrate 301, and a bottom passivation layer 401, a top passivation layer 403, a redistribution layer 409, an under bump metallization layer 411, and a conductive bump 413 may be formed on the second substrate 301. A photolithography process may be performed to define a position of the through substrate via 405. After the photolithography process, an etch process, such as an anisotropic dry etch process, may be performed to form an opening in the second substrate 301. The spacers 407 may be formed in the opening. A conductive material such as copper, aluminum, or titanium may be deposited into the opening by a deposition process. After the deposition process, a planarization process, such as chemical mechanical polishing, may be performed to remove excess material, provide a substantially flat surface for subsequent processing steps, and conformally form the through substrate via 405.

With reference to FIG. 18, the bottom passivation layer 401 and the top passivation layer 403 may be sequentially formed on the second substrate 301. The redistribution layer 409 may be formed in the bottom passivation layer 401 and on the through substrate via 405. A portion of the bottom passivation layer 401 and a portion of the top passivation layer 403 may be recessed to form an opening to expose a portion of a top surface of the redistribution layer 409. The under bump metallization layer 411 and the conductive bump 413 may be sequentially formed in the opening.

With reference to FIGS. 7 and 18, at step S19, an energy treatment may be performed to turn the first energy-removable layer 609 into a first porous layer 213. The energy treatment process may be performed on the intermediate semiconductor device in FIG. 18 by applying the energy source thereto. The energy source may include heat, light, or a combination thereof. When heat is used as the energy source, a temperature of the energy treatment may be between about 800° C. and about 900° C. When light is used as the energy source, an ultraviolet light may be applied. The energy treatment may remove the decomposable porogen material from the energy-removable material to generate empty spaces (pores), with the base material remaining in place. In some embodiments, the energy treatment process may be performed before the bonding of the second semiconductor structure 300. In some embodiments, the energy treatment process may be performed concurrently with the bonding process of the second semiconductor structure 300 by providing a temperature between about 800° C. and about 900° C. for the bonding process. As a result, the complexity of fabrication of the semiconductor device 10A may be reduced and a fabrication cost of the semiconductor device 10A may be also reduced.

FIGS. 19 to 26 illustrate, in schematic cross-sectional view diagrams, a flow for fabricating a semiconductor device 10E in accordance with another embodiment of the present disclosure.

Figure 19:
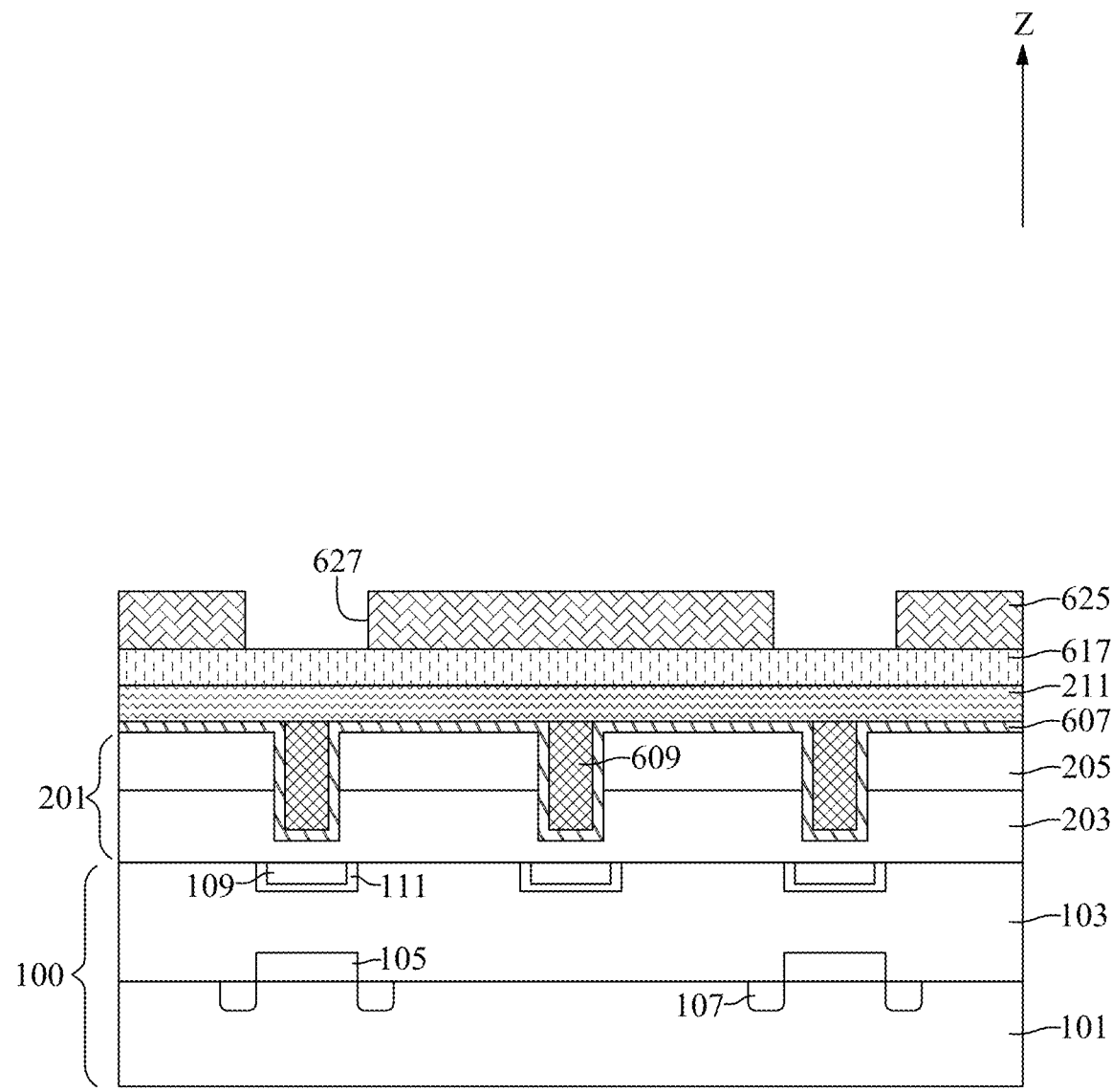
FIGS. 19 to 26 illustrate, in schematic cross-sectional view diagrams, a flow for fabricating a semiconductor device in accordance with one embodiment of the present disclosure.

With reference to FIG. 19, an intermediate semiconductor device may be fabricated by a procedure similar to that illustrated in FIGS. 8 to 12. Subsequently, the first top liner 211 and a second energy-removable layer 617 may be sequentially formed on the top surface of the layer of bottom liner material 607. The second energy-removable layer 617 may be formed of a same material as the first energy-removable layer 609. The energy-removable material of the second energy-removable layer 617 may include about 25% to 50% of the decomposable porogen material, and about 50% to 75% of the base material. A third mask layer 625 and a plurality of fifth openings 627 may be formed on the second energy-removable layer 617 using a procedure similar to that used to form the first mask layer 601 and the plurality of first openings 603 illustrated in FIG. 9.

Figure 20:
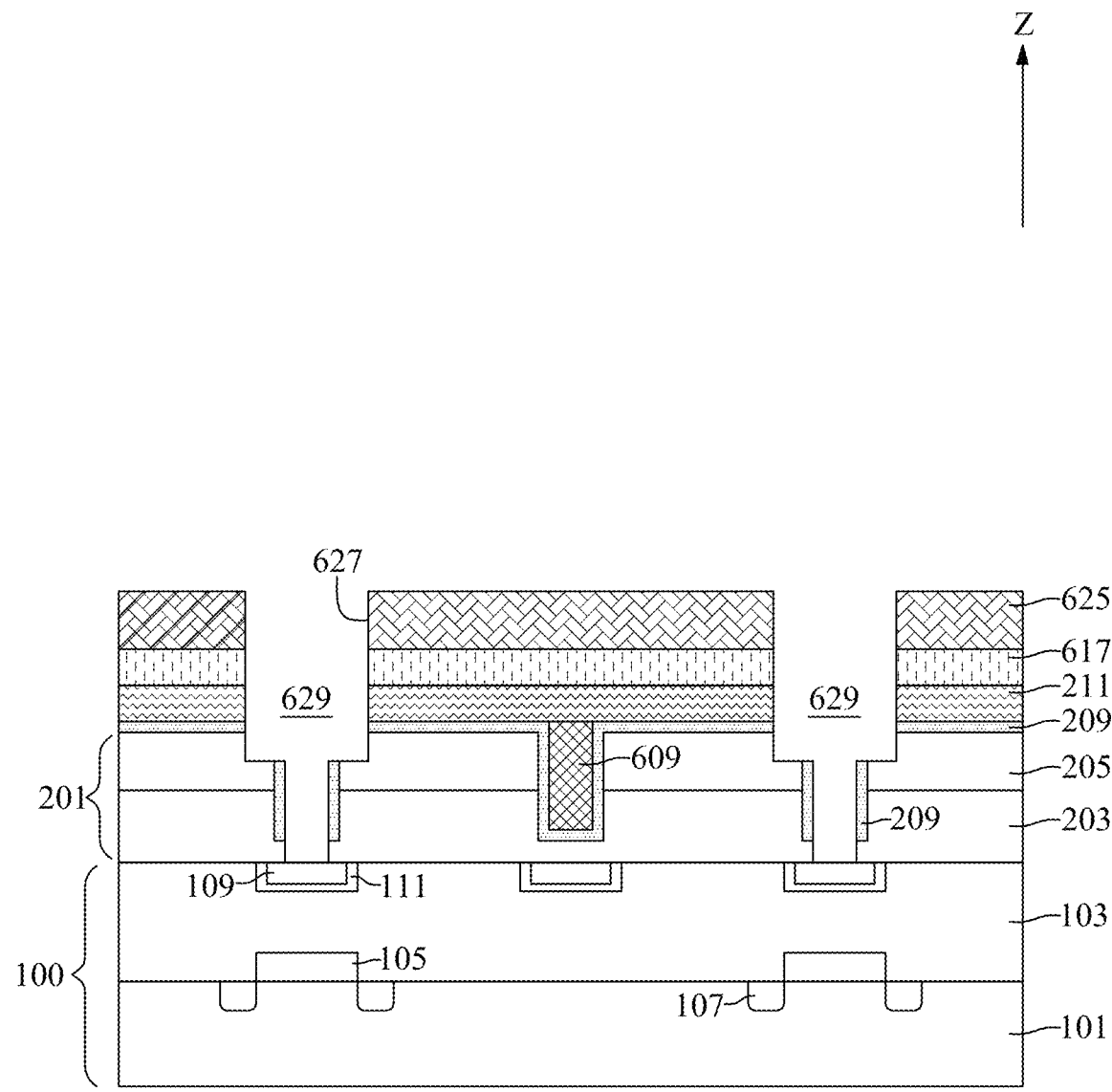
Figure 21:
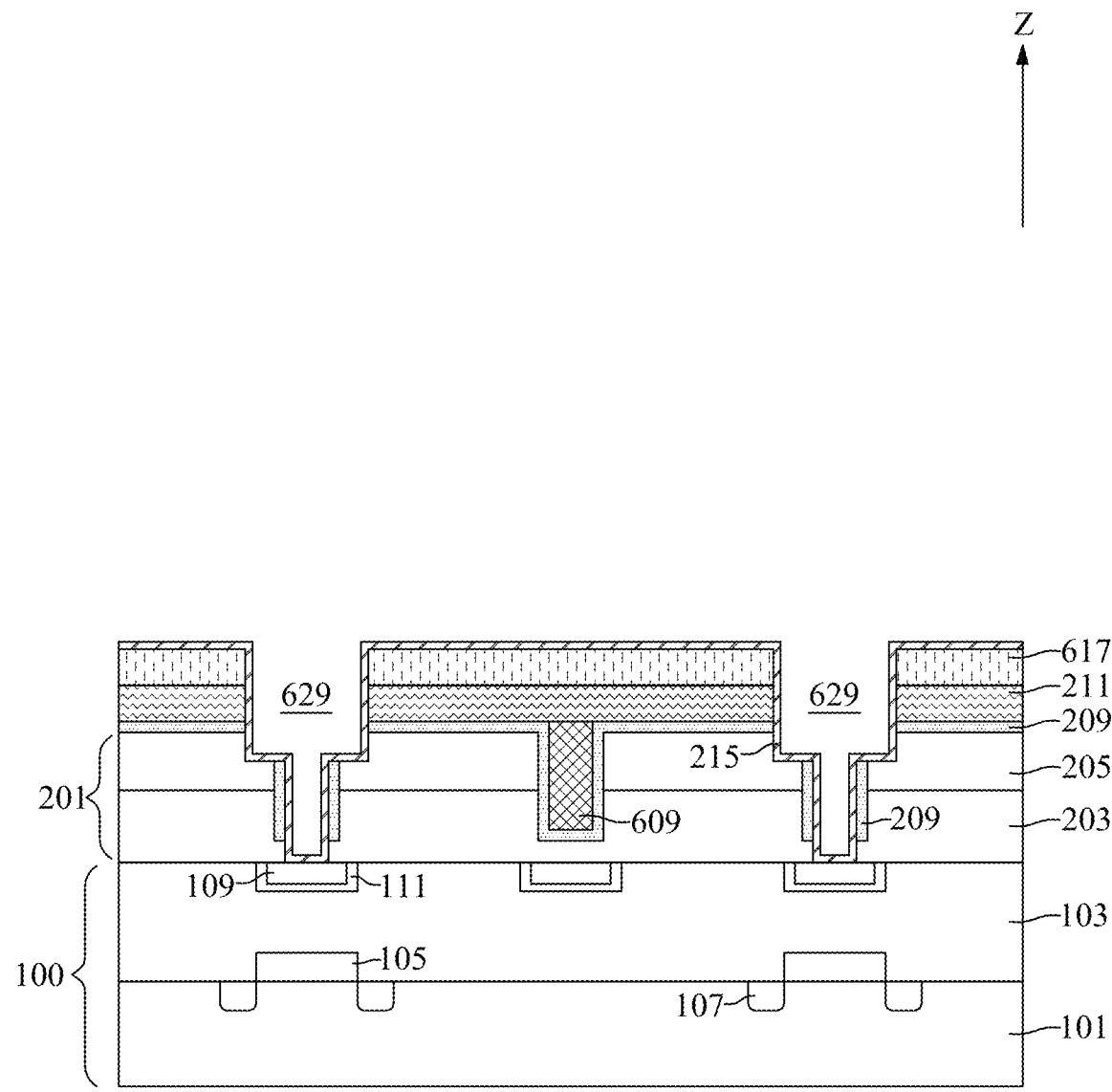
Figure 22:
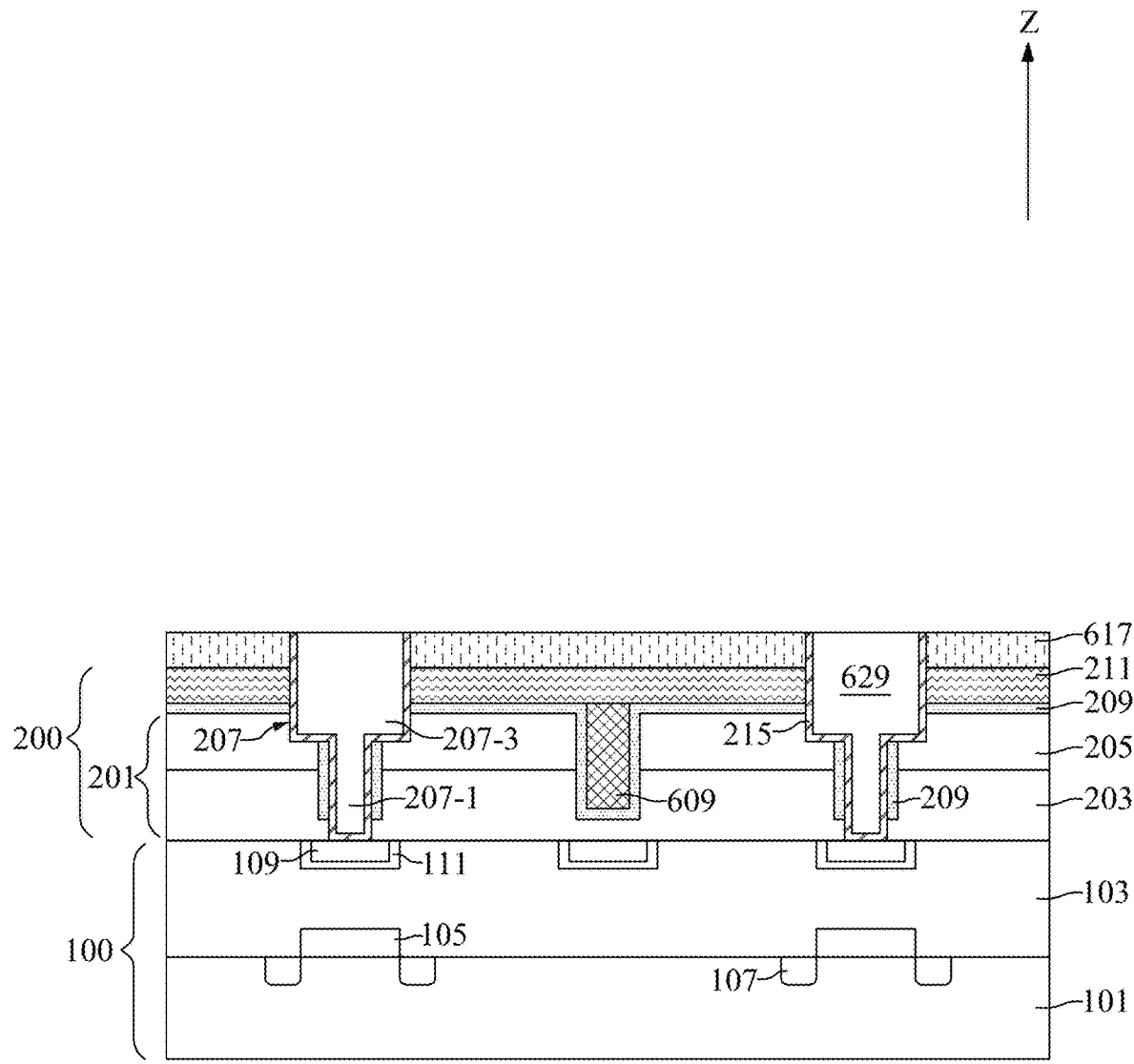
Figure 23:
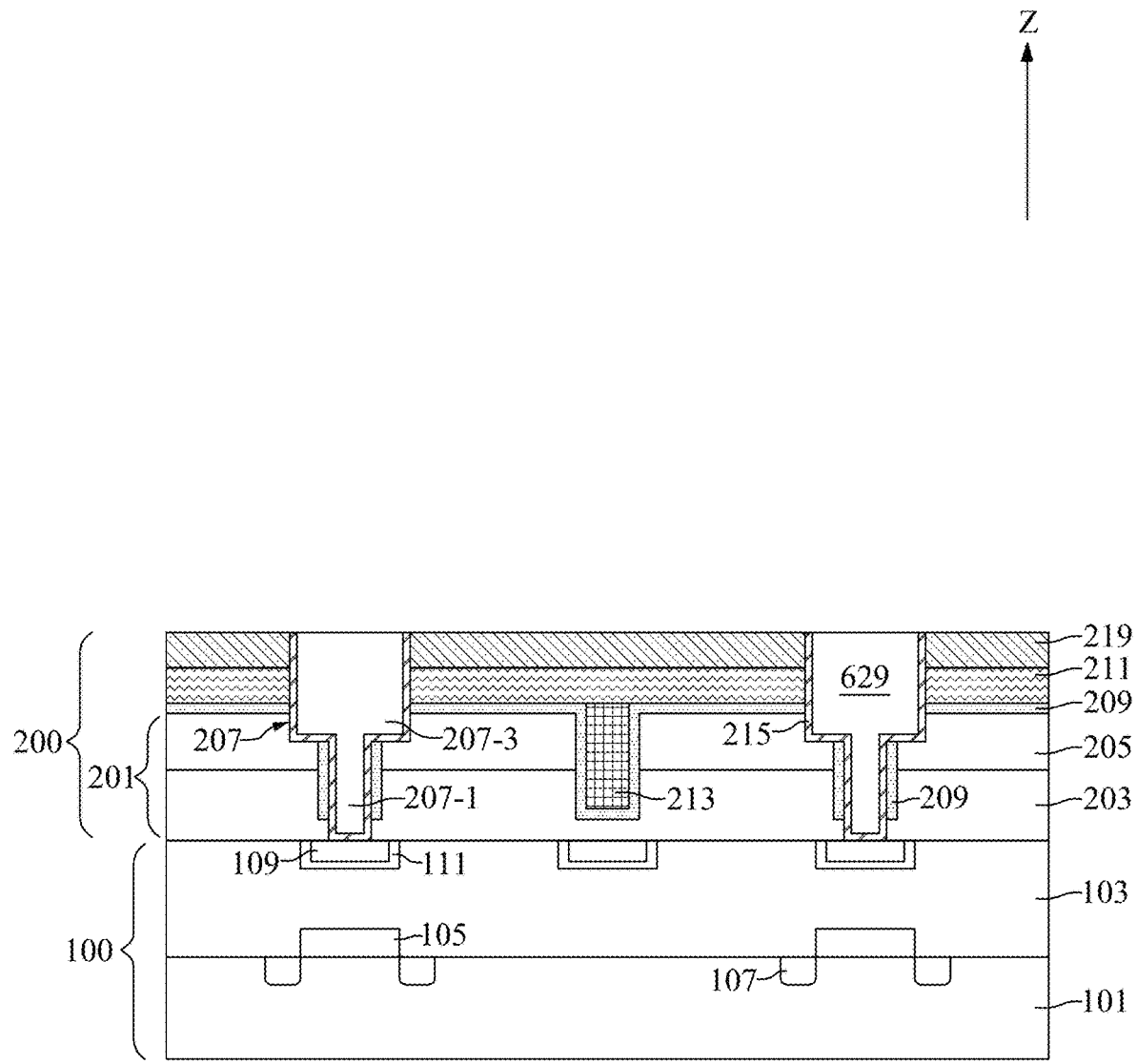

With reference to FIG. 20, a plurality of third trenches 629 may be formed using a procedure similar to that used to form the plurality of second trenches 615 illustrated in FIG. 14. With reference to FIGS. 21 and 22, the barrier layers 215 of the first connecting structure 200 and the plurality of first conductive layers 207 may be formed using a procedure similar to that illustrated in FIGS. 15 and 16. With reference to FIG. 23, an energy treatment may be performed to turn the second energy-removable layer 617 into a first porous layer 213 and turn the first energy-removable layer 609 into the first porous layer 213. The first porous layer 213 may have a porosity between about 25% and about 50%.

Figure 24:
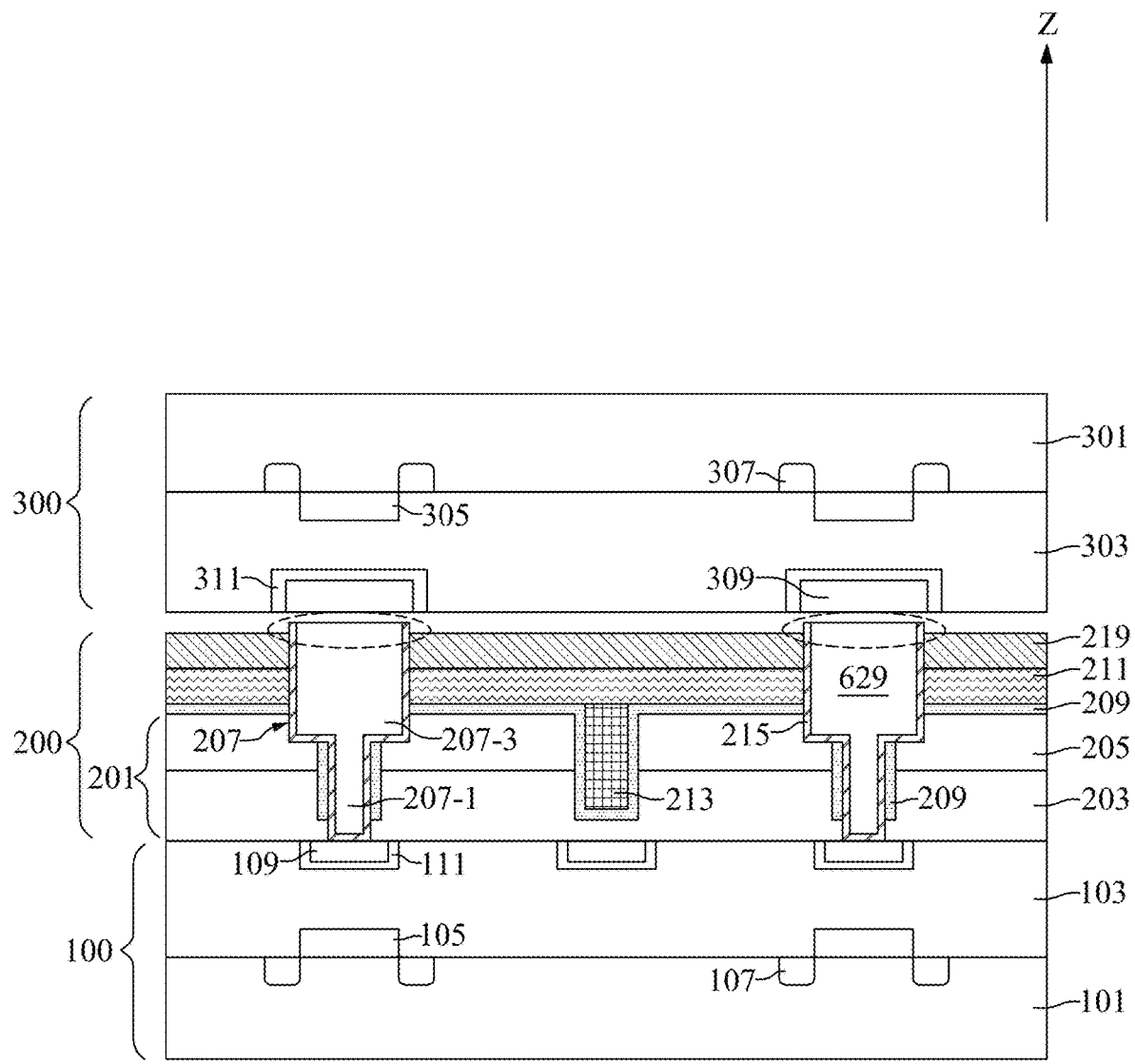
Figure 25:
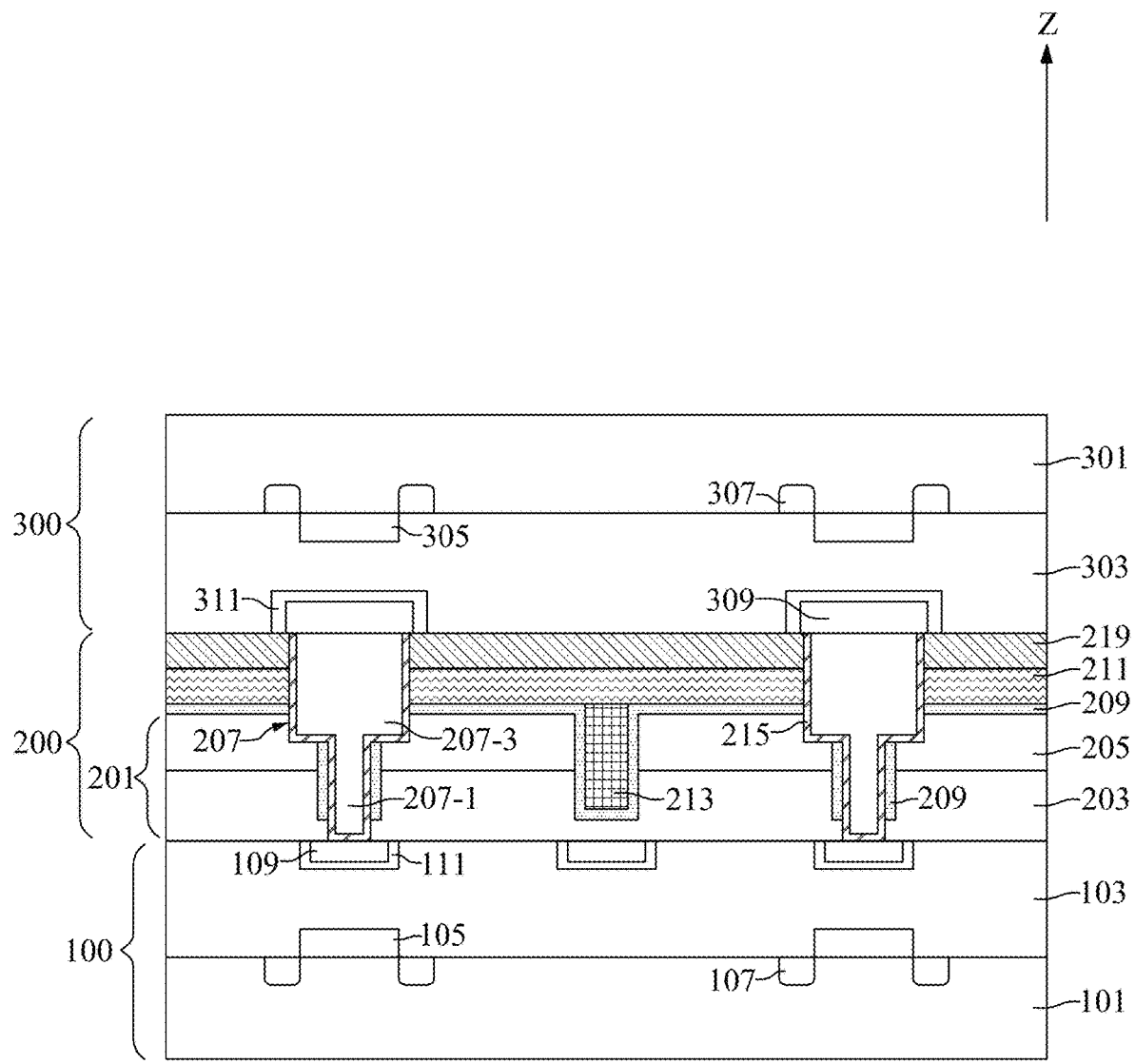
Figure 26:
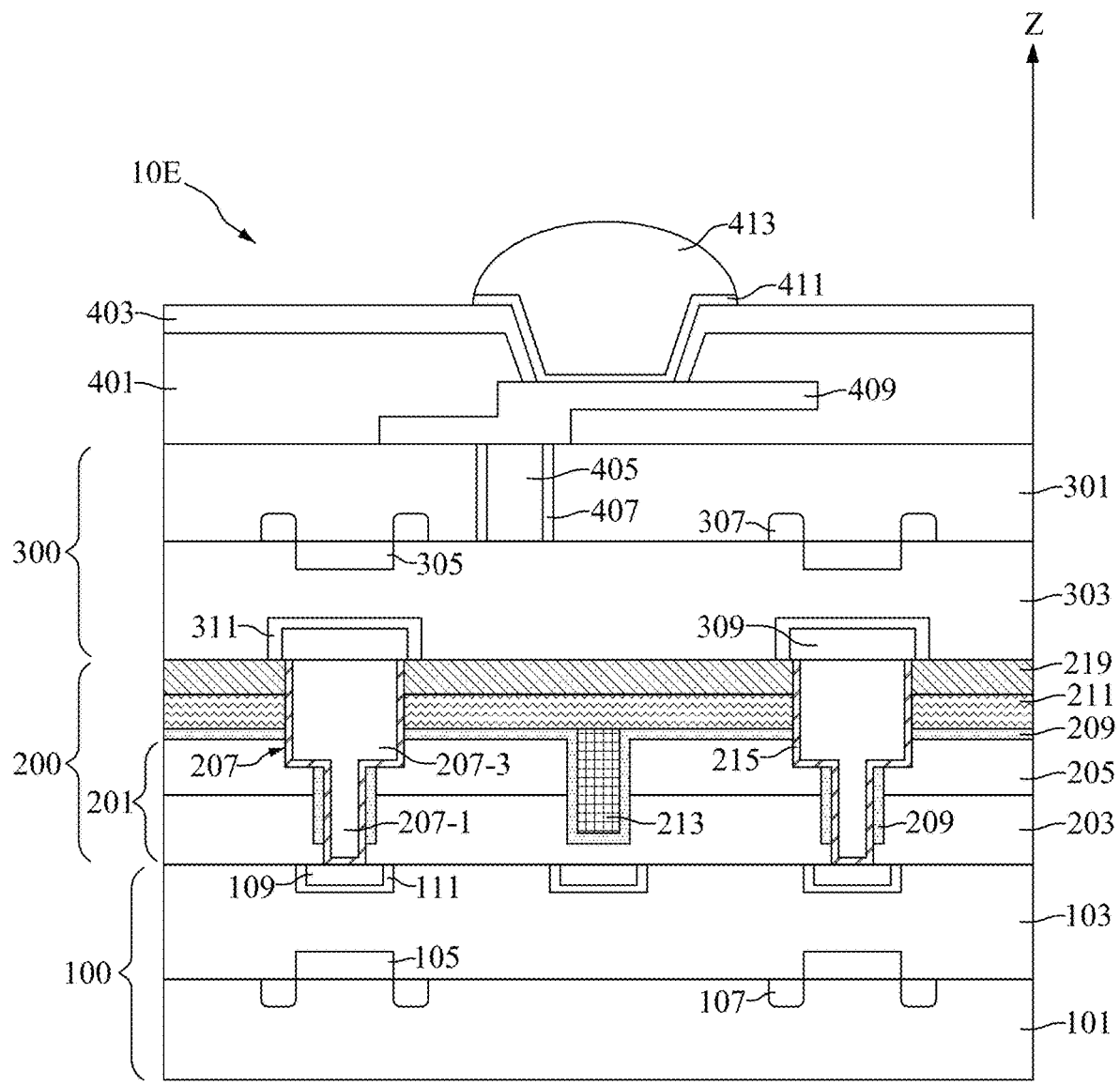

With reference to FIGS. 24 and 25, a second semiconductor structure 300 may be bonded to the first connecting structure 200 through a bonding process. During the bonding process between the first connecting structure 200 and the second semiconductor structure 300, the third porous layer 219 may be thinned due to its porous characteristic. As a result, the top surfaces of the plurality of first conductive layers 207 and the top surfaces of the barrier layers 215 of the first connecting structure 200 may form a plurality of protrusions (indicated by dashed ovals in FIG. 24). The plurality of protrusions may prevent the metal-to-metal bonding from dielectrically intervening with the plurality of first top liners 211 or the second insulating layer 303. Therefore, a more reliable bonding between the second semiconductor structure 300 and the first connecting structure 200 may be achieved. With reference to FIG. 26, elements may be formed using a procedure similar to that illustrated in FIG. 18.

FIGS. 27 to 30 illustrate, in schematic cross-sectional view diagrams, a flow for fabricating a semiconductor device 10F in accordance with another embodiment of the present disclosure.

Figure 27:
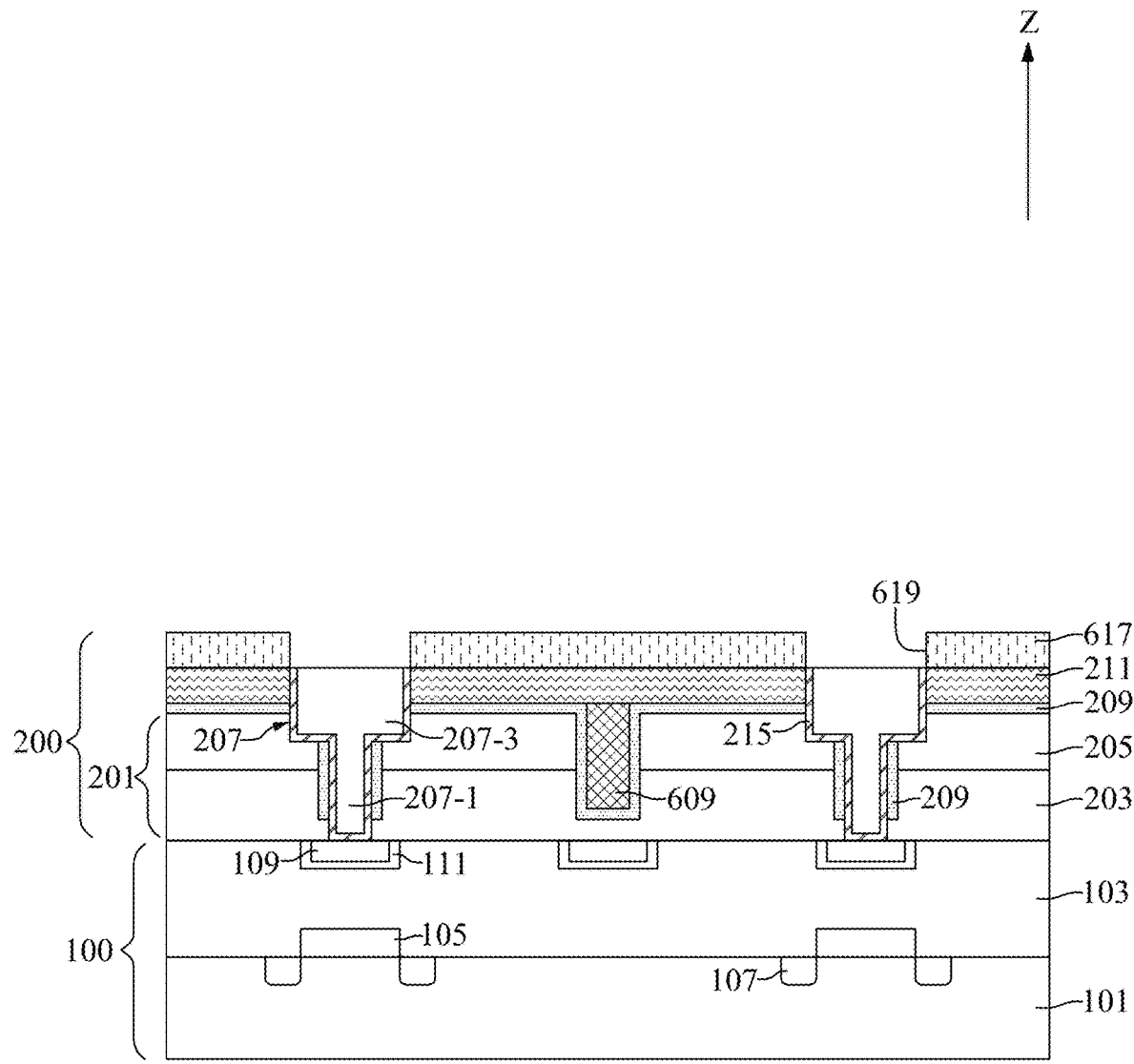
FIGS. 27 to 30 illustrate, in schematic cross-sectional view diagrams, a flow for fabricating a semiconductor device in accordance with one embodiment of the present disclosure.
Figure 28:
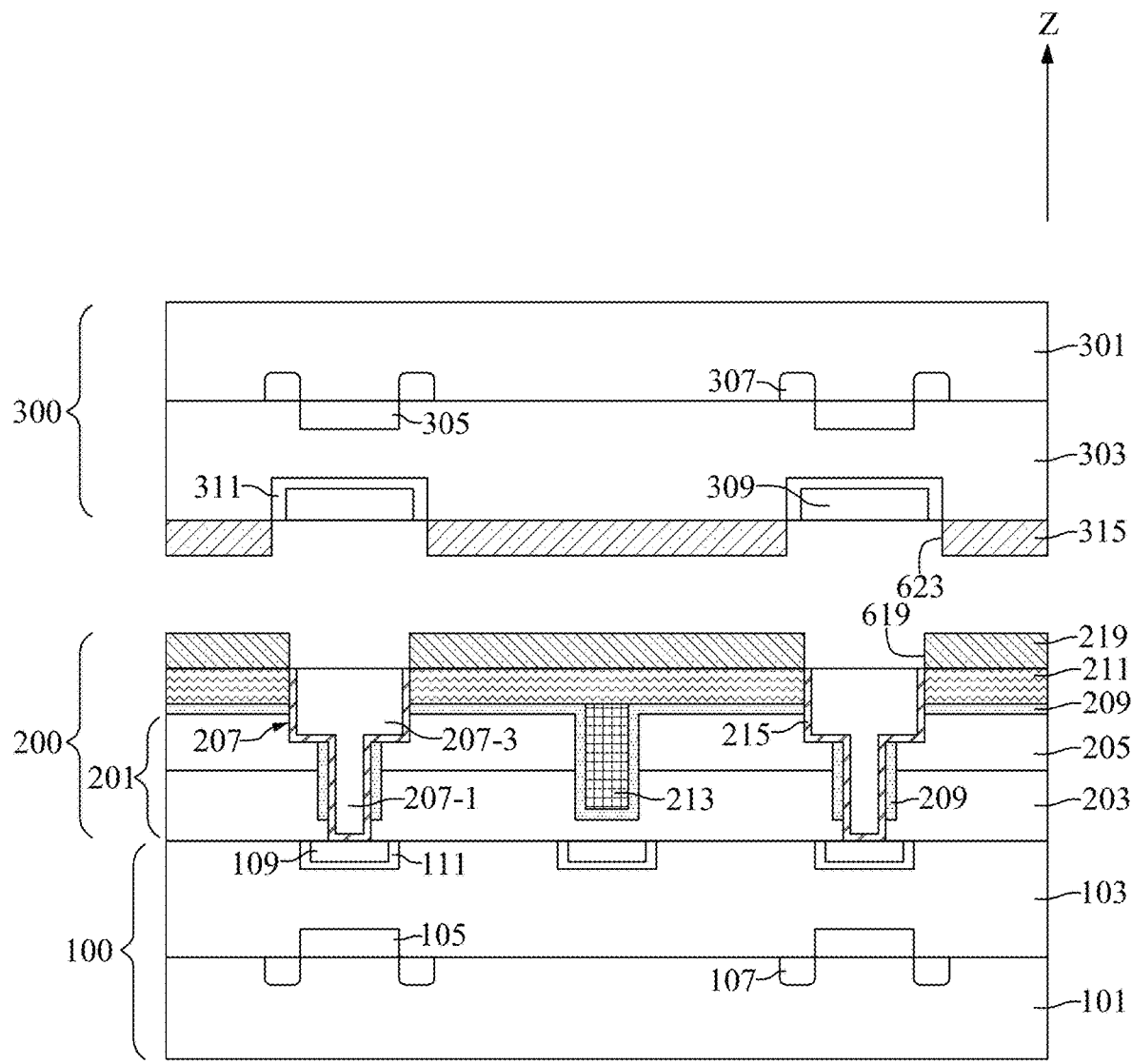

With reference to FIG. 27, the first semiconductor structure 100 and the first connecting structure 200 may be formed using a procedure similar to that illustrated in FIGS. 8 to 16. A second energy-removable layer 617 may be formed on the top surfaces of the plurality of first top liners 211 and the top surfaces of the plurality of first conductive layers 207. A photolithography process and an etch process may be performed to remove portions of the second energy-removable layer 617 and form a plurality of third openings 619 in the second energy-removable layer 617. The plurality of third openings 619 may expose top surfaces of the plurality of first conductive layers 207. With reference to FIG. 28, an energy treatment may be performed to turn the second energy-removable layer 617 into a first porous layer 213 and turn the first energy-removable layer 609 into the first porous layer 213.

With reference to FIG. 28, the second semiconductor structure 300 may be provided using a procedure similar to that illustrated in FIG. 17. The fourth porous layer 315 and the plurality of fourth openings 623 may be formed using a procedure similar to that used to form the third porous layer 219 and the plurality of third openings 619. The plurality of fourth openings 623 may have a width greater than a width of the plurality of third openings 619. The fourth porous layer 315 may have a porosity less than a porosity of the third porous layer 219. In some embodiments, the porosity of the third porous layer 219 may be between about 50% and about 85%. In addition, the fourth porous layer 315 may have a hardness greater than that of the third porous layer 219.

Figure 29:
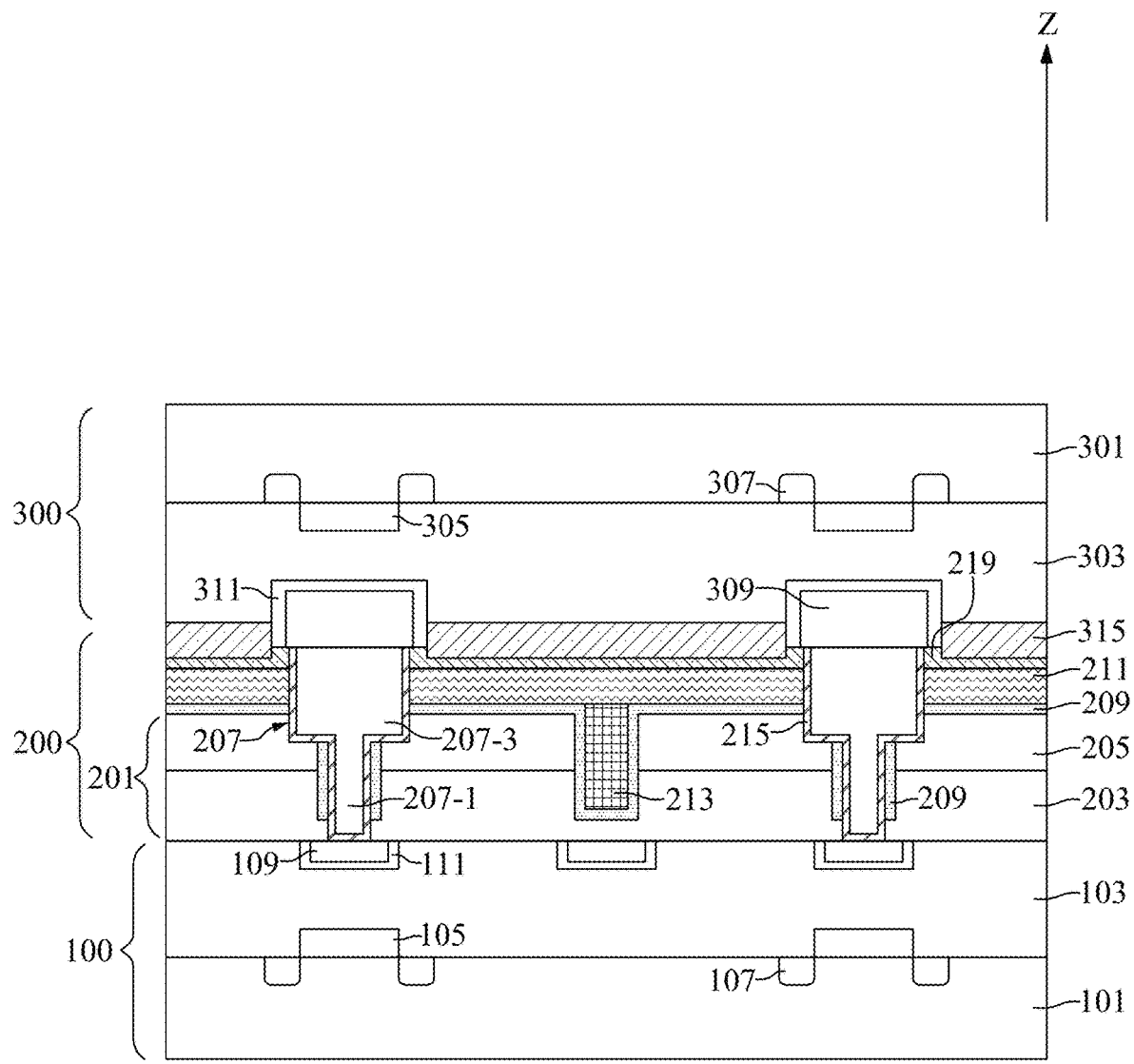

With reference to FIGS. 28 and 29, the first connecting structure 200 and the second semiconductor structure 300 may be bonded through a bonding process similar to that illustrated in FIG. 17. Due to the porosity (or hardness) difference, step-shaped cross-sectional profiles may be formed near the bonding interfaces of the plurality of first conductive layers 207 and the plurality of second conductive features 309.

The first connecting structure 400 may be formed on the second semiconductor structure 200 using a procedure similar to that illustrated in FIG. 13. Subsequently, the second semiconductor structure 200 and the first connecting structure 400 may be disposed in an upside-down manner and above the first semiconductor structure 100.

Figure 30:
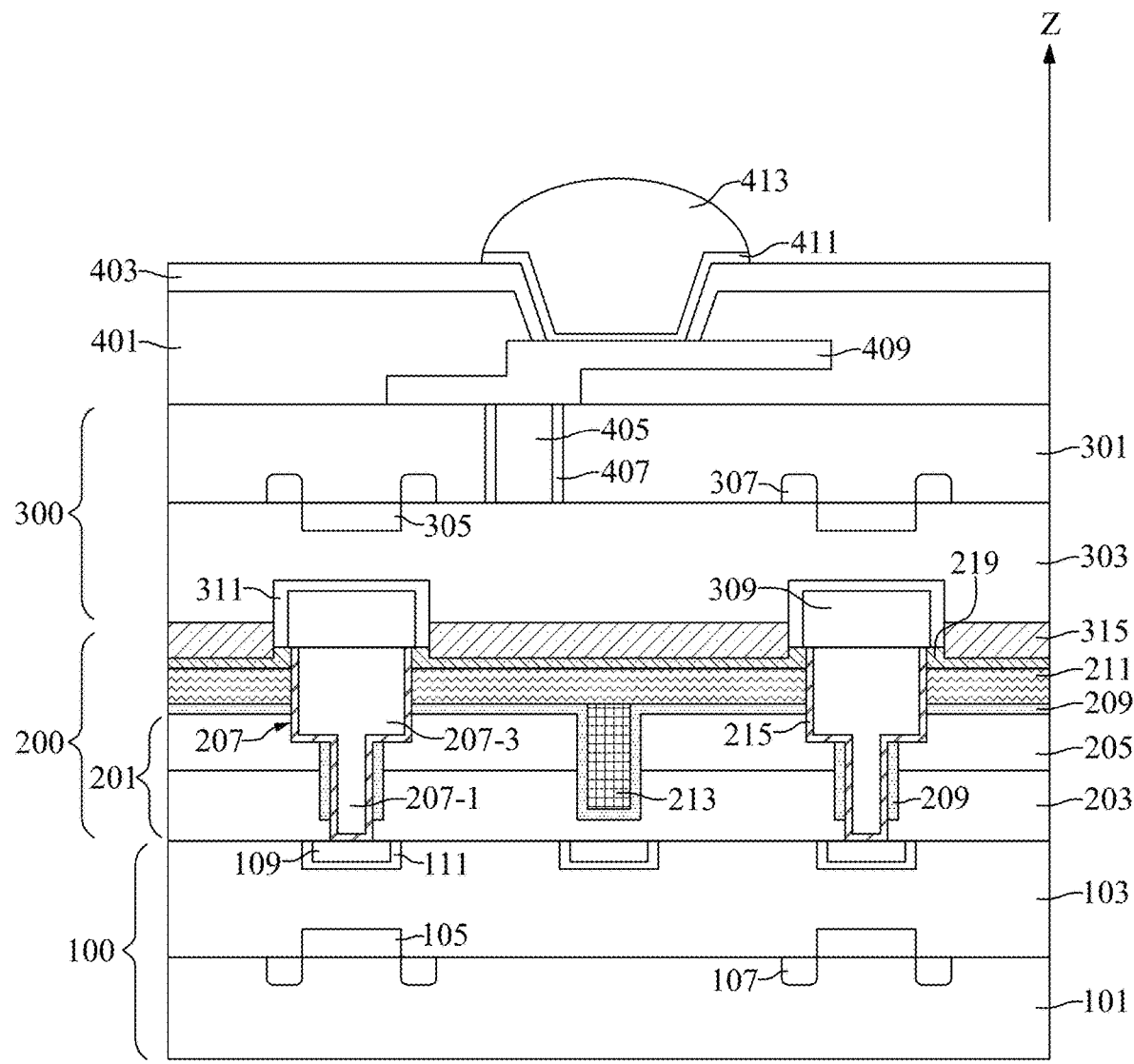

With reference to FIG. 22, a bonding process may be performed to bond the first connecting structure 400 to the first semiconductor structure 100. A thermal treatment may be applied to the intermediate semiconductor device in FIG. 22 to achieve the hybrid bonding of the first semiconductor structure 100 to the first connecting structure 400. With reference to FIG. 23, a second bottom passivation layer 221 may be formed on the second substrate 201. A second pad structure 231 may be formed and may penetrate the second bottom passivation layer 221, the second substrate 201, and an upper portion of the second insulating layer 205. The second pad structure 231 may be electrically connected to one of the plurality of second conductive lines 207. With reference to FIG. 30, elements may be formed using a procedure similar to that illustrated in FIG. 18.

One aspect of the present disclosure provides a semiconductor device comprising: a first semiconductor structure; a first connecting structure comprising a first connecting insulating layer positioned on the first semiconductor structure, two first conductive layers positioned in the first connecting insulating layer, and a first porous layer positioned between the two first conductive layers; and a second semiconductor structure positioned on the first connecting structure and comprising two second conductive features positioned on the two first conductive layers; wherein the first conductive layer has a first width, the second conductive feature has a second width greater than the first width, forming a step-shaped cross-sectional profile near an interface of the first conductive layer and the second conductive feature.

Another aspect of the present disclosure provides a method for fabricating a semiconductor device, comprising: providing a first semiconductor structure; forming a first connecting structure comprising a first connecting insulating layer on the first semiconductor structure, two first conductive layers in the first connecting insulating layer, and a first porous layer between the two first conductive layers; and bonding a second semiconductor structure to the first connecting structure, wherein the second semiconductor structure comprises two second conductive features contacting the two first conductive layers; wherein the first conductive layer has a first width, the second conductive feature has a second width greater than the first width, forming a step-shaped cross-sectional profile near an interface of the first conductive layer and the second conductive feature.

Due to the design of the semiconductor device of the present disclosure, multiple semiconductor devices may be connected together through the first connecting structure to provide a more sophisticated function while occupying less space. Therefore, the cost of the semiconductor device may be reduced, and the profitability of the semiconductor device may be increased. In addition, the first porous layer may alleviate an interference effect between electrical signals induced in or applied to the first connecting structure.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor device, comprising:
a first semiconductor structure;
a first connecting structure comprising a first connecting insulating layer positioned on the first semiconductor structure, two first conductive layers positioned in the first connecting insulating layer, and a first porous layer positioned between the two first conductive layers; and
a second semiconductor structure positioned on the first connecting structure and comprising two second conductive features positioned on the two first conductive layers;
a third porous layer positioned on the connecting insulating layer, and a fourth porous layer positioned between the third porous layer and the second semiconductor structure wherein a porosity of the fourth porous layer is less than a porosity of the third porous layer;
wherein the first conductive layer has a first width, the second conductive feature has a second width greater than the first width, forming a step-shaped cross-sectional profile near an interface of the first conductive layer and the second conductive feature.

2. The semiconductor device of claim 1, wherein the third porous layer positioned between the connecting insulating layer and the second semiconductor structure and surrounding the first conductive layer, wherein a porosity of the third porous layer is between about 25% and about 50%.

3. The semiconductor device of claim 2, wherein the first connecting insulating layer comprises a first bottom insulating layer positioned on the first semiconductor structure, and a first top insulating layer positioned on the first bottom insulating layer, wherein the two first conductive layers penetrate the first bottom insulating layer and the first top insulating layer, and the first porous layer penetrates the first top insulating layer and extends into the first bottom insulating layer.

4. The semiconductor device of claim 3, wherein the two first conductive layers comprise two first portions positioned on the first semiconductor structure and two second portions positioned on the first portions, wherein a width of the second portions is greater than a width of the first portions.

5. The semiconductor device of claim 4, further comprising a plurality of first top liners positioned on the first top insulating layer and surrounding the two second portions.

6. The semiconductor device of claim 5, further comprising a plurality of first bottom liners positioned between the plurality of first top liners and the first top insulating layer, between the two first conductive layers and the first top insulating layer, between the two first conductive layers and the first bottom insulating layer, between the first porous layer and the first top insulating layer, and between the first porous layer and the first bottom insulating layer.

7. The semiconductor device of claim 6, wherein bottom surfaces of the plurality of first bottom liners are at a vertical level higher than a vertical level of a top surface of the first semiconductor structure.

8. The semiconductor device of claim 7, further comprising a plurality of barrier layers positioned between the two first conductive layers and the plurality of first top liners, between the two first conductive layers and the plurality of first bottom liners, between the two first conductive layers and the first top insulating layer, between the two first conductive layers and the first bottom insulating layer, and between the two first conductive layers and the first semiconductor structure.

9. The semiconductor device of claim 8, wherein the first semiconductor structure comprises a plurality of first conductive features positioned below the first portions, wherein a width of the plurality of first conductive features is greater than a width of the first portions.

10. The semiconductor device of claim 9, wherein a porosity of the first porous layer is between about 25% and about 100%.

11. The semiconductor device of claim 8, wherein the second semiconductor structure comprises a plurality of guard rings positioned on the first connecting structure, and the first connecting structure comprises a plurality of first supporting layers positioned below the plurality of guard rings, wherein a thickness of the plurality of first supporting layers is less than a thickness of the two first conductive layers.

12. The semiconductor device of claim 8, further comprising a second connecting structure positioned between the first connecting structure and the second semiconductor structure, wherein the second connecting structure comprises two second conductive layers positioned between the two first conductive layers and the plurality of second conductive features, and a second porous layer positioned between the two second conductive layers, wherein a porosity of the second porous layer is between about 25% and about 100%.

13. A method for fabricating a semiconductor device, comprising:
providing a first semiconductor structure;
forming a first connecting structure comprising a first connecting insulating layer on the first semiconductor structure, two first conductive layers in the first connecting insulating layer, and a first porous layer between the two first conductive layers;
bonding a second semiconductor structure to the first connecting structure, wherein the second semiconductor structure comprises two second conductive features contacting the two first conductive layers;
forming a third porous layer on the connecting insulating layer, and
forming a fourth porous layer of the second semiconductor structure;
wherein the fourth porous layer is less than a porosity of the third porous layer;
wherein the first conductive layer has a first width, the second conductive feature has a second width greater than the first width, forming a step-shaped cross-sectional profile near an interface of the first conductive layer and the second conductive feature.

14. The method for fabricating the semiconductor device of claim 13, wherein the third porous layer positioned between the connecting insulating layer and the second semiconductor structure and surrounding the first conductive layer, wherein a porosity of the third porous layer is between about 25% and about 50%.

15. The method for fabricating the semiconductor device of claim 13, wherein forming the first connecting structure comprises:
forming the first connecting insulating layer on the first semiconductor structure;
forming the two first conductive layers in the first connecting insulating layer and a first energy-removable layer between the two first conductive layers; and
performing an energy treatment to turn the first energy-removable layer into the first porous layer.

16. The method for fabricating the semiconductor device of claim 15, wherein the energy-removable layer comprises a base material and a decomposable porogen material.

17. The method for fabricating the semiconductor device of claim 16, wherein the base material comprises methylsilsesquioxane, low-dielectric materials, or silicon oxide.

18. The method for fabricating the semiconductor device of claim 17, wherein an energy source of the energy treatment is heat, light, or a combination thereof.

* * * * *